(12) United States Patent
Cohen et al.

(10) Patent No.: US 6,591,200 B1
(45) Date of Patent: Jul. 8, 2003

(54) METHOD AND SYSTEM FOR PERFORMANCE TESTING OF ROTATING MACHINES

(75) Inventors: Menachem Cohen, Jerusalem (IL); Eyal Cohen, Tel Aviv (IL)

(73) Assignee: M.E.A. Motor Inspection Ltd., Netanya (IL)

( * ) Notice: Subject to any disclaimer, the term of this patent is extended or adjusted under 35 U.S.C. 154(b) by 0 days.

(21) Appl. No.: 09/719,780

(22) PCT Filed: Jun. 1, 1999

(86) PCT No.: PCT/IL99/00290
§ 371 (c)(1),
(2), (4) Date: Mar. 9, 2001

(87) PCT Pub. No.: WO99/66335
PCT Pub. Date: Dec. 23, 1999

(30) Foreign Application Priority Data

Jun. 16, 1998 (IL) .................................... 124932

(51) Int. Cl.⁷ .................................................. G01B 5/30
(52) U.S. Cl. .................... 702/38; 702/41; 702/145; 73/116; 73/862.326; 324/160
(58) Field of Search ............................ 702/38, 145, 43, 702/41; 73/117.3, 862.324, 862.325, 862.08, 862.09, 862.326, 116; 324/209, 163, 86, 162, 160

(56) References Cited

U.S. PATENT DOCUMENTS

| | | |
|---|---|---|
| 2,674,125 A | 4/1954 | Eagan et al. |
| 3,651,690 A | 3/1972 | Pagdin et al. |

(List continued on next page.)

FOREIGN PATENT DOCUMENTS

| | | |
|---|---|---|
| DE | 1 232 774 | 1/1967 |
| DE | 26 23 494 | 12/1977 |
| EP | 0 457 086 | 11/1991 |
| FR | 2 566 132 | 12/1985 |
| GB | 2 127 549 | 4/1984 |
| HU | 205662 | 5/1989 |
| JP | 59 160766 | 9/1984 |
| SU | 1275336 | 12/1986 |

OTHER PUBLICATIONS

Szabodos et al., "Measurement of the Torque–Speed Characteristics of Induction Motors Using an Improved New Digital Approach", *Transactions of Energy Conversion*, (1990), vol. 5 No. 3, pp. 565–570.

(List continued on next page.)

*Primary Examiner*—John Barlow
*Assistant Examiner*—Hien Vo
(74) *Attorney, Agent, or Firm*—Browdy and Neimark, P.L.L.C.

(57) ABSTRACT

A method and system for dynamic testing of loaded or unloaded electrical rotating electric motors, wherein a dynamic speed-time characteristic of the electric motor is determined during acceleration of the motor from standstill to steady-state speed or after the motor has reached steady-state speed, depending on the performance characteristic to be derived, and analyzed to derive a performance characteristic of the electric motor. Accurate measurement of the motor speed may be achieved by attaching to the shaft a digital rotary encoder which generates successive HIGH and LOW logic levels during respective successive time intervals. The shaft is rotated and the respective periods of each successive logic level are accumulated so as to allow derivation of the angular rotation or a function thereof of the shaft. Dynamic performance may be determined accurately as well as steady-state performance without slowing the electric motor's speed of rotation by use of a flywheel.

71 Claims, 23 Drawing Sheets

U.S. PATENT DOCUMENTS

| | | |
|---|---|---|
| 3,888,116 A | 6/1975 | Spinella |
| 4,125,295 A | 11/1978 | Ruhnau et al. |
| 4,169,371 A | 10/1979 | Witschi et al. |
| 4,204,425 A | 5/1980 | Mallick, Jr. |
| 4,245,322 A | 1/1981 | Batchelor |
| 4,535,288 A | 8/1985 | Vitulli, Jr. |
| 4,550,618 A | 11/1985 | Kohama et al. |
| 4,811,238 A | 3/1989 | Gerrath et al. |
| 4,992,730 A | 2/1991 | Hagiya |
| 5,039,028 A | 8/1991 | Svedlund et al. |
| 5,218,860 A | 6/1993 | Storar |
| 5,239,490 A | 8/1993 | Masaki et al. |
| 5,297,044 A | 3/1994 | Sakaki et al. |
| 5,345,171 A | 9/1994 | Simmons et al. |
| 5,390,545 A | 2/1995 | Doan |
| 5,440,915 A | 8/1995 | Storar |
| 5,530,343 A | 6/1996 | Bowers, III et al. |
| 5,616,999 A | 4/1997 | Matsumura et al. |
| 5,631,411 A | 5/1997 | Harms et al. |
| 5,744,723 A | 4/1998 | Piety |
| 5,757,676 A | 5/1998 | Hobelsgerger |

OTHER PUBLICATIONS

Chrisco, "Automated, Full Load Motor Testing at Production Speeds", *Appliance*, (1998), pp. 116–119.

Chan, "Determination of the Torque–Speed Characteristic of an induction motor using a curve–fitting technique", *Publication Unknown*, Date Unknown, pp. 360–365.

Jin, "Design and Implementations of DSP–Based Personal Instrumentations system for testing performance of electrical motors", *IEEE*, (1993), pp. 75–80.

Brochure of DIGITORQUE, Automations Technology.

METHOD AND SYSTEM FOR PERFORMANCE TESTING OF ROTATING MACHINES

FIELD OF THE INVENTION

This invention relates generally to the accurate measurement of angular rotation and, in particular, to the performance testing of rotating machines.

BACKGROUND OF THE INVENTION

Conventional approaches to the performance testing of electric motors generally measure steady-state performance of the motor after the elimination of transient effects. To this end, motor speed data is collected as a function of time and the data is filtered so as to remove fluctuations in order thereby to derive standard motor performance characteristics as set out in the appropriate IEEE standards, for example. Such characteristics invariably relate to the torque-speed performance of the motor at no load whereby the motor is accelerated from rest under no load conditions, and the torque is derived as a function of the time derivative of the speed curve in accordance with Newton's Second Law of Motion. Additionally, so-called "signature" tests as well as load tests are performed, although in all cases the effects of fluctuations are eliminated.

Signature testing is an extension of no-load testing that utilizes faster measuring techniques and processing in order to compare a specific motor's no-load performance with that of a pre-calibrated "master" motor which serves as a yardstick against which production line motors may be assessed. Load tests measure the motor's performance under operating conditions whereby a specific torque is applied to the running motor under test, and the resulting speed, current and power are measured.

Typically, the motor speed is measured using a tachometer coupled to the motor's axis. This allows acquisition of the motor speed in analog form and suffers from low resolution and severe noise contamination. For this reason, digital methods are preferred and significant effort has been expended during the last two or three decades to allow more accurate digital sampling of the rotational velocity of motor shafts and the like. Many such methods still employ what are essentially analog transducers to derive the speed signal and then digitize the speed signal using A/D converters, so as to allow subsequent processing to be performed digitally.

R. Szabados et al. describe such a technique in "Measurement of the Torque-speed Characteristic of Induction Motors using an improved new digital approach" appearing in Transaction on Energy Conversion, Vol. 5, No. Sep. 3, 1990. Their method uses a fast data acquisition system to sample the output of a d.c. tachometer as well as other relevant parameters such as line current and voltage. The measured data is then processed digitally to remove the noise, perform dynamic average filtering to eliminate extraneous coupling vibrations and to determine the relative torque profile from the time derivative of the speed curve using Newton's Law. Since the removal of noise also eliminates the fluctuations, it thus emerges that the elimination of fluctuations by filtering the raw speed data is an inherent feature of the method proposed in this article.

Indeed, it is further shown that the raw speed data is contaminated and that the first task of the data processing phase involves removing the extraneous signals without distorting the speed profile. A major contribution of the above-referenced paper resides in the improved filtering algorithms which are presented.

U.S. Pat. No. 5,218,860 (Storar) assigned to Automation Technology, Inc. discloses an alternative approach wherein, rather than measure the speed using analog transducers, a digital gray scale (incremental) encoder is used. FIG. 1 shows pictorially a motor test bed 10 wherein a motor is mechanically coupled to a test system according to U.S. Pat. No. 5,218,860 via a test fixture consisting of a rotating shaft 12 supported on high-quality bearings 13. Mounted on the shaft 12 are a flywheel 14 of known inertia and a high-resolution rotary digital encoder 15. The flywheel 14 acts as an inertial load whereby torque may be determined according to the equation:

$$T = I \cdot \frac{dv}{dt} \quad (1)$$

where: T=Torque,
  I=Inertia of flywheel,
  v=speed, and
  t=time.

As explained in U.S. Pat. No. 5,218,860, the torque-speed characteristics are sampled at regular known time intervals during the time it takes for the motor to reach full speed from standstill. The measurement time interval is fixed by a crystal oscillator and is usually 16.67 ms, corresponding to the period of one 60-Hz power line cycle. The change in speed is determined by the rotary encoder which resolves as little as 0.0072° of angular displacement. Torque and speed are computed for each 16.67 ms period from the time power is applied until it reaches its maximum no-load speed. The inertia of the flywheel attached to the motor is so selected that the motor reaches full speed in about 4 seconds, this being the time it takes to sample some 240 torque and speed results, enough to describe the entire torque-speed curve from standstill to full speed.

The digital rotary encoder as described U.S. Pat. No. 5,218,860 offers a significant improvement over analog transducers, and allows the measurement of certain motor characteristics that were previously not easily obtained. However, the resolution of the device is still relatively poor since, in effect, a very large number of pulses are averaged during each sample time period. Specifically, it is stated in U.S. Pat. No. 5,218,860 that the incremental encoder produces 25,000 pulses during each full rotation of the motor shaft. Assuming an average motor speed of 10,000 rpm, this means that the number of pulses produced per 16.67 ms time period is nearly 70,000. The actual number of pulses is counted by a binary counter so as to provide an accurate indication of the angular speed of the motor. However, during a sampling period as large as 16.67 ms, the fluctuations are no longer measurable: thus allowing only the smoothed characteristics to be determined. Moreover, there would appear to be no particular advantage in employing a rotary encoder having such a high resolution, as well as cost, given that such a coarse sampling interval is employed. Theoretically, the resolution could be improved simply by sampling at smaller time periods. However, in practice it is difficult to achieve this accurately and inexpensively using current technology.

Moreover, the flywheel attached to the motor shaft loads the motor and, whilst this does not derogate from the static performance of the motor, it substantially eliminates the fluctuations to which the transient effects are subjected. Consequently, loading the motor as taught in U.S. Pat. No. 5,218,860 does not allow measurement of the dynamic performance of the motor.

The present inventor has found that the dynamic performance of the motor provides invaluable information about the motor, such that without a knowledge of the dynamic performance of the motor it is impossible to derive fundamental behavior of the motor. However, for the reasons set out above, the dynamic performance data is unattainable during a sample period as large as 16 ms, since during this time period most of the fluctuations on the transient part of the curve are lost. Even regardless of the actual magnitude of the sampling time period, and bearing in mind that some improvement can clearly be achieved by reducing the sampling time period conducive with prevailing technology and price constraints, any improvement is limited in scope. This follows from the fact that counting pulses during a fixed time period, however small, can never allow optimum results to be achieved. Thus, even if the sampling time period could be reduced indefinitely (which, of course, it cannot) it can never be reduced to less than the period of a single pulse since, in such case, no data would be obtained during the sample period. On the other hand, whilst increasing the sampling time period ensures that sample data will be obtained, it does so at the cost of producing multiple data per sample. This means that the resolution thereby obtained is inevitably less than the theoretical maximum.

Furthermore, in order to obtain a sufficient number of sample points using the approach disclosed by U.S. Pat. No. 5,218,860, it is necessary to ensure that the time required for the motor to attain full speed is extended to several seconds. This is achieved by means of the flywheel having sufficient inertia to delay the steady state response of the motor. It would obviously be preferable to allow the relevant speed characteristics to be derived in less time without, of course, compromising on the number of sample points and, at the same time, providing details of the fluctuations on the transient performance which disappear when the motor is loaded.

U.S. Pat. No. 4,535.288 to Joseph L. Vitulli, Jr, discloses a method for determining the rotational speed of a moving shaft in a spatially limited environment, wherein the time between a sequentially successive pair of encoder (transducer) pulses is used to determine the speed. Updated rotational speed is computed from a flier pair of sequentially successive pulses, which are non-sequential to the earlier pulses. The rotary encoder described by Vitulli can be likened to a toothed wheel having sixty equally spaced teeth, each of which gives rise to an output signal having a first voltage level when rotating past a pickup. When the space between adjacent teeth passes the pickup, an output signal having a second voltage level is produced Typically, the first and second voltage levels translate to digital signals having logic HIGH and Low levels, respectively, such that a pulse train is produced. Thus, assuming that there are provided sixty equally spaced teeth which give the same angular for the high and low levels, the angle of rotation corresponding to each logic HIGH level is 2π/120 radians. By measuring the time duration of each logic HIGH level, the angular speed can thereby be calculated.

In practice, however, even the best rotary encoders have a duty cycle accuracy of only ±10%, which means that whilst the distance between the Start of adjacent teeth (corresponding to the period of the pulse train) is constant, the width of each tooth is subject to an accuracy of ±10%. Since angular speed is calculated on the basis of the measured time for each tooth passing the pickup, it is clear that his is dependent on the actual width of each tooth and is thus subject to a maximum error of 20%.

JP 59 160766 (Fanuc) discloses a speed detecting device of a servo-motor is determined using a rotary encoder in a manner similar to that described in U.S. Pat. No 4,535,288 and thus subject to he same problems of inaccuracies owing to duty cycle errors. The is moreover no suggestion to test the marine when unloaded.

GB 2 127 549 discloses a test bed for supporting a motor during measurement of the motor's torque. The system disclosed thereby appears to be very similar to U.S. Pat. No. 5,218,860 discussed at length above and is subject to the same deficiencies. Specifically, it is to be noted that the motor whose steady-state and transient torque are measured by GB 2 127 549 is loaded in order to reduce the acceleration of the motor (loading the motor causes all the dynamic phnomenon spoken at the present application to disappear). It is clear from the description in GB 2 127 549 on page 1 lines 48 to 53 that such loading is necessary in order to record the transient torque-speed characteristics of the motor starting from zero speed to full speed. It will be apparent that reducing the acceleration of the motor as suggested by GB 2 127 549 militates against the derivation of the motor's transient characteristics whose correct determination is an essential feature of the present invention. U.S. Pat. No. 4,169,371 (Witschi et al.) discloses a method and apparatus for measuring the torque and/or power of a drive system in dynamic operation based on the time differentiation of the speed of the drive to determine acceleration. The system is loaded and it is therefore apparent that the dynamic characteristics whose determination is the principal objective of the present invention are lost.

U.S. Pat. No. 5,631,411 (Harms et al.) discloses an He monitoring apparatus that calculates the speed of a motor. It is clear from FIG. 1 that an inertial load (i.e. a flywheel) is conned to the motor and therefore here, too, the dynamic characteristics whose determination is the principal objective of the present invention are lost.

EP 457 086 discloses an apparatus for the contactless measurement of the local dragged-in torque in a worm machine. At least two position sensors or proximity switches are arranged in the worm casing. During the rotation of the worm shank, the sensors scan the worm shank surface and, on the basis of detected characteristics, generate measurement pulses which, together with a speed signal, are suppliable to an electronic analysis circuit, which calculates the local dragged-in torque in a segment of the worm shank, within the product space. The apparatus operates in conjunction with a device for measuring the integral torque being arranged between the worm shack drive and the product space of the worm machine. There is no suggestion here either to measure torque of an unloaded machine.

U.S. Pat. No. 5,390,545 (Doan) discloses an apparatus for measuring torsional vibrations of rotating machinery wherein a wheel having a plurality of spaced apart teeth is connected to the rotating machinery. A sensor detects the speed of wheel rotation and responsively produces a speed signal that has a frequency proportional to the rotational wheel speed. A timing deice receives the speed signal, determines the period of the most recent pulse of the speed signal, and responsively produces an instantaneous period signal that has a value representative of the determined period.

U.S. Pat. No. 4,992,730 (Hagiya) discloses a method of computing the rotating speed of a rotating body by setting speed computation reference time periods with respect to a pulse train signal obtained from the output of a rotating speed sensor; measuring time length from the last pulse edge in the previous speed computation reference time period to the last pulse edge in the current speed computation reference time period; and computing the rotating speed of the rotating body on the basis of the result of the time length measurement.

SUMMARY OF THE MENTION

It is therefore an object of the invention to provide a method and system for measuring rotational speed in which the drawbacks associated with hitherto-proposed are substantially improved or eliminated.

Such an objective is realized in accordance with a broad aspect of the invention by providing a method for measuring an angular rotation of a rotating shaft, the method characterized by the steps of:

(a) attaching to the shaft a digital rotary encoder which successively generates opposing binary logic states such that any pair of sequential logic states corresponds to a known angular rotation of the shaft, rotating the shaft, (c) separately measuring a respective time period associated with each successive logic state generated by the digital rotary encoder, and (d) surnming said respective time periods associated with each successive logic state so as to derive an accumulated elapsed time interval of successive pairs of logic states generated by the digital rotary encoder thereby allowing derivation of the angular rotation or a function thereof of the shaft.

The invention thus allows an improved approach to testing motor or engine speed according to the time that elapses during a known angular rotation of the shaft. According to such an approach, the elapsed time is measured for the logical states to change from LOW to HIGH and back to LOW or vice versa. Although the tie interval during which the logic state remains either LOW or HIGH is subject to duty cycle error, the combined time interval for sequential logic states is an accurate reflection of a known angular rotation. Thus measuring the accumulated elapsed time interval between successive pairs of logic states avoids duty cycle errors affecting the speed results whilst reflecting any change in speed on the fly. Consider, for example, a rotary encoder that produces 60 pulses per revolution. In the case of U.S. Pat. No. 4,535,288, the shaft revolutions per minute (rpm) can be determined in a one second degree interval, and in the case of a very high quality encoder (with duty cycle error in the order of ±10%) will give rise to a measured speed inaccuracy of ±10%.

The method according to the invention finds particular application for testing an electric motor or a component thereof the method characterized by the steps of:

(a) attaching an unloaded shaft of the electric motor to a digital rotary encoder which generals opposing binary logic states such that any pair of sequential logic states corresponds to a known angular rotation of the rotating electric motor, (b) measuring an accumulated elapsed time period of successive pairs of logic states generated by the digital rotary encoder during rotation of the electric motor so as to allow derivation of a dynamic speed-time characteristic of the rotating electric motor or a function thereof, and (c) using the dynamic speed-time characteristic of the unloaded rotating electric motor to derive static torque speed or dynamic torque speed or oscillating torque during steady state or speed and torque specturn during steady state of the unloaded rotating electric motor. Preferably, there is further included the step of:

(d) calculating a torque of the rotating machine by reference to a predetermined moment of inertia of a rotor hereof and the measured speed characteristic of the rowing machine.

The invention also contemplates an apparatus for deter dynamic and static speed-time, torque-time and speed-torque characteristics of a rotating machine or of a component thereof. By using a pre-calibrated rotor, tests may be performed on identical machines using different stators so as to provide relative performance data (both static and dynamic) of the different stators. Likewise, using a pre-calibrated stator, tests may be performed on identical machines using different rotors so as to provide relative performance data (both static and dynamic) of the different rotors.

It will thus be understood that the method and apparatus according to the invention allow dynamic and static performance data to be derived without requiring the connection of an external inertial load to the machine's axis. This allows the machine to reach steady state (i.e. non-transient) operation more quickly and allows calibration of the machine to be effected more quickly. This is of particular importance when small machines are mass-produced and must be tested on the production line. Moreover, it allows the measurement of fluctuations, which have hitherto eluded measurement.

It is admittedly suggested in U.S. Pat. No. 5,218,860 [col. 1, line 29] that for larger motors, the mass of the armature may be sufficiently large to provide a proper inertial load. That is to say U.S. Pat. No. 5,218,860 also allows for the external inertial load to be dispensed with, albeit for large motors only. However, this may be only be done because large motors, being inherently inertial, in any case take a relatively long time to reach steady state speed, thus allowing sufficient sample points to be obtained. This is not the case for small low-inertia motors where the external inertial load is mandatory in U.S. Pat. No. 5,218,860 in order deliberately to slow down the time to reach steady state speed and thus allow sufficient sample points to be obtained. It is thus clear that U.S. Pat. No. 5,218,860 does not allow extrapolation to the present invention which allows for the flywheel to be dispensed with even for small motors, since a major object of the invention is to reduce, rather than increase, the time to reach steady state speed.

The invention also allows measurement of oscillating torque and speed during steady state condition so as to derive speed-time and torque-time characteristics in both the time and frequency domains. In such case, a flywheel may be used to slow down the time for the machine to reach steady state, thereby producing steady state oscillating torque and speed phenomena during the acceleration. This allows faults with the machine to be highlighted that would not otherwise be apparent.

The invention also permits greater flexibility of testing the rotating machine. A user can control the sampling time and the time from which the sampling begins. The user can likewise control x-axis (time and frequency) and y-axis (torque and speed) thus allowing the device to be used as a rotating machine analyzer.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF PREFERRED EMBODIMENTS

Figure 1:
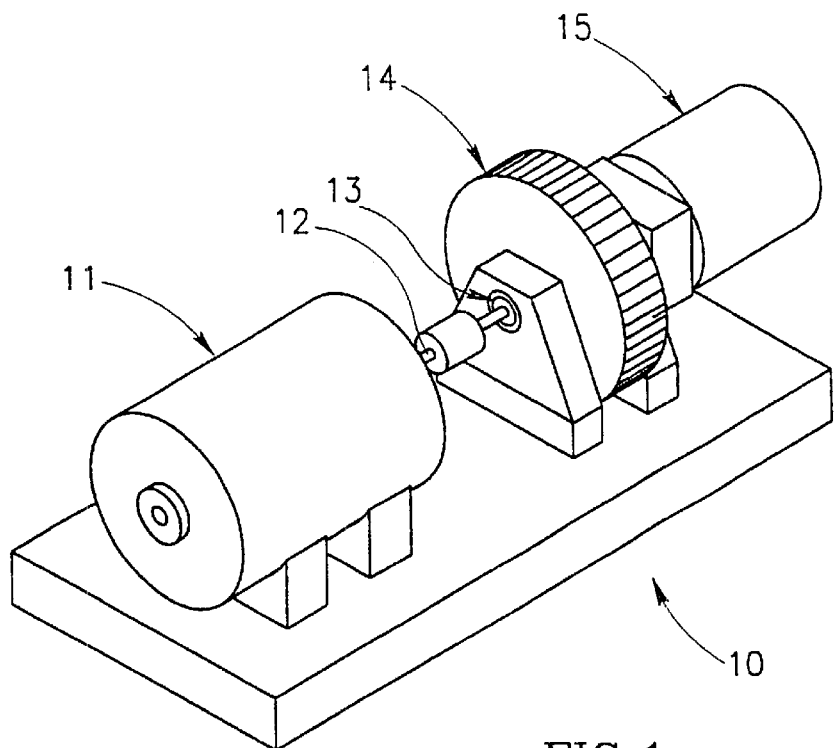
FIG. 1 shows pictorially a prior art motor test bed.
Figure 2:
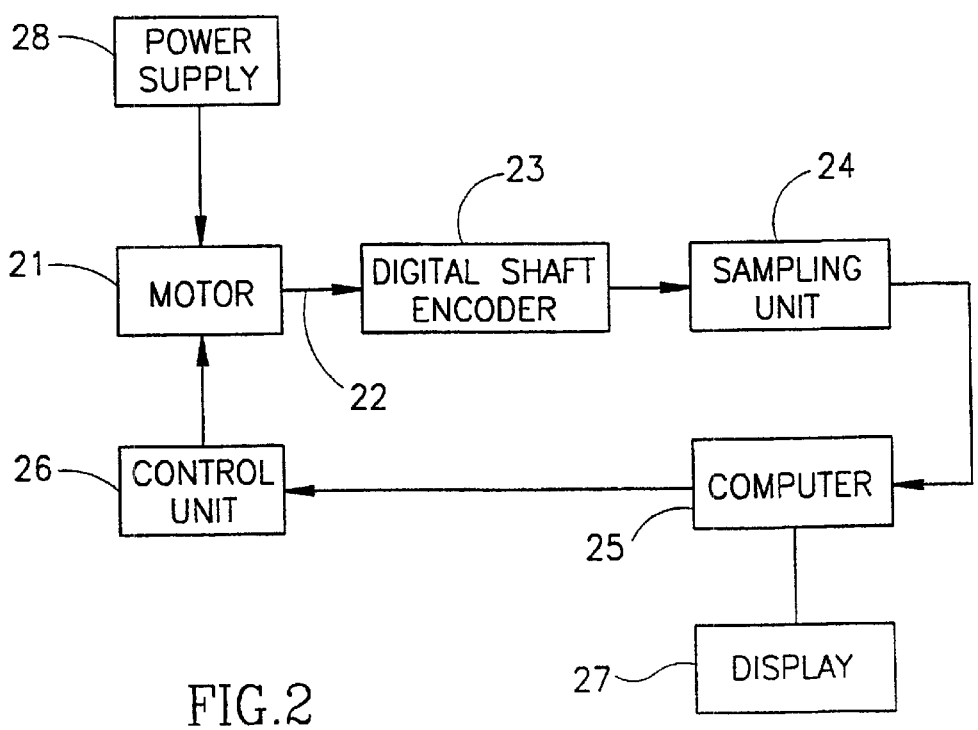
FIG. 2 is a block diagram showing functionally a motor test system according to the invention.

FIG. 2 shows functionally a motor test system depicted generally as 20 comprising an induction motor 21 having a shaft 22 thereof coupled to a digital shaft encoder 23 of known type. The shaft encoder 23 does not require very high resolution and, in practice, may generate 5,000 pulses per revolution of the motor shaft. As the motor 21 rotates, the shaft encoder 23 produces logic levels that are sampled by a sampling unit 24 that measures the elapsed time for the logical states to change from LOW to HIGH and back to LOW or vice versa. The successive time intervals are fed to a computer 25 that processes the time data so as to derive the dynamic speed characteristic of the motor 21 as a function of the elapsed time and store in a memory thereof. The motor 21 is actuated via a control unit 26 that is responsively coupled to the computer 25 so that, for example, power to the motor 21 may be interrupted once the motor 21 has achieved full steady state speed, thus signifying the completion of the test procedure. Connected to the computer 25 is a display device 27 such as a display monitor or plotter. The motor 21 is energized by a power supply 28 which may be actuated at a precisely known time.

Figure 3:
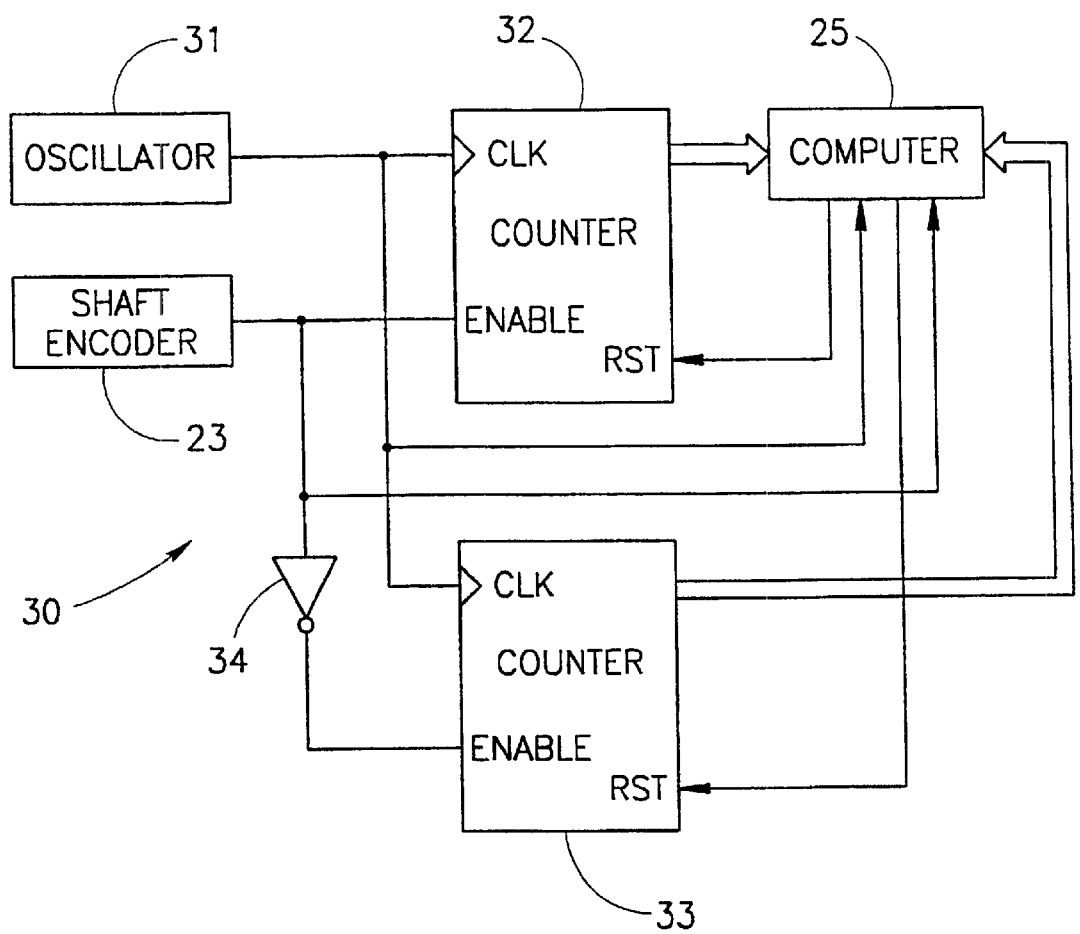
FIG. 3 is a block diagram showing a detail of the motor test system depicted in FIG. 2.

FIG. 3 shows a timing circuit 30 within the sampling unit 24 comprising an oscillator 31 fed to the clock input (CLK) of a first counter 32 and a second counter 33. The output of the shaft encoder 22 is fed to the enable input (ENABLE) of the first counter 32 whose output is fed to the computer 25. The output of the shaft encoder 22 is inverted by an inverter 34 and fed to the enable input (ENABLE) of the second counter 33 whose output is also fed to the computer 25. Likewise, the reset terminal (RST) of the first counter 32 is responsively coupled to the computer 25 and also the reset terminal (RST) of the second counter 33 is responsively coupled to the computer 25 so as to enable the first counter 32 and the second counter 33 to be reset thereby, as will now be explained.

The operation of the timing circuit 30 is as follows. The oscillator 31 based on a quartz crystal produces high frequency pulses having a known, stable frequency. As the shaft encoder 23 rotates together with the motor shaft, it produces sequential opposing binary logical LOW and HIGH states of lower frequency than that of the oscillator 31. The relatively low frequency logic levels generated by the shaft encoder 23 are fed to the enable input of the first counter 32 and, after inversion, are fed to the enable input of the second counter 33. Consequently, between successive ENABLE signals, the first counter 32 measures the number of relatively high frequency pulses produced by the oscillator 31 when the encoder is at logic HIGH and the second counter 33 measures the number of relatively high frequency pulses produced by the oscillator 31 when the encoder is at logic LOW, both results being fed to the computer 25. The computer 25 is responsive to a change in state of the first counter ENABLE signal for capturing the data on the respective outputs of the first counter 32 and the second counter 33 and to feeding a reset signal to the respective RST inputs thereof. This clears the first counter 32 when the encoder is at logic LOW and clears the second counter 33 when the encoder is at logic EEGH. The output of the first counter 32 between successive ENABLE signals is thus accurately representative of the time taken for the shaft encoder 23 to remain at logic HIGH. Likewise, the output of the second counter 32 between successive ENABLE signals is accurately representative of the time taken for the shaft encoder 23 to remain at logic LOW.

Even assuming that the shaft encoder 23 has a resolution of only 5,000 pulses per revolution and that the speed of the motor 21 is as low as 1,000 rpm, the shaft encoder 23 will output 5 million pulses per minute. Thus, each pulse has a period of approximately 10 $\mu$s, which is well within the capacity of the counter 32 to measure accurately. Moreover, by comparison with the system described in above-referenced U.S. Pat. No. 5,218,860, within a 16.67 ms time interval, the shaft encoder 23 will output nearly 1,667 pulses each of which is a sampling point, as opposed to the single sampling point contemplated by U.S. Pat. No. 5,218,860.

Since U.S. Pat. No. 5,218,860 associates the measurement of time with many hundreds of pulses, any duty cycle error associated with each pulse is effectively annulled, albeit at the expense of requiring a much longer time interval for measuring the accumulated angular rotation of the shaft. As explained above, this militates against determination of dynamic response of the machine.

On the other hand, U.S. Pat. No. 4,535,288 to Joseph L. Vitulli, Jr. does suggest time measurement of a single pulse only and therefore prima facie does allow determination of dynamic response. However, as noted, his approach is subject to duty cycle errors which, for the sake of greater clarity, are now further elaborated. The manufacturer of a rotary encoder specifies the number of pulses per revolution of the rotary encoder and also specifies the duty cycle. If the duty cycle is specified as being 50%, then the time for each pulse measured by Vitulli, Jr. actually corresponds to half the nominal angular increment during each pulse of the encoder. For example, if there are 3,600 pulses per revolution, this corresponds to ten pulses per degree rotation of the encoder. Vitulli, Jr. measures the time for one nominal half cycle of a single pulse and calculates from this the nominal time period of each encoder pulse based on the duty cycle specified by the manufacturer. However, this is subject to inaccuracies owing to the inevitable errors in the duty cycle specified by the manufacturer, which are currently in the order of ±10%.

Thus, whilst Vitulli, Jr. provides a nominal angular rotation in a single pulse of the rotary encoder, thereby allowing calculation of angular velocity during a single pulse thereof, the actual result is inaccurate.

Figure 4:
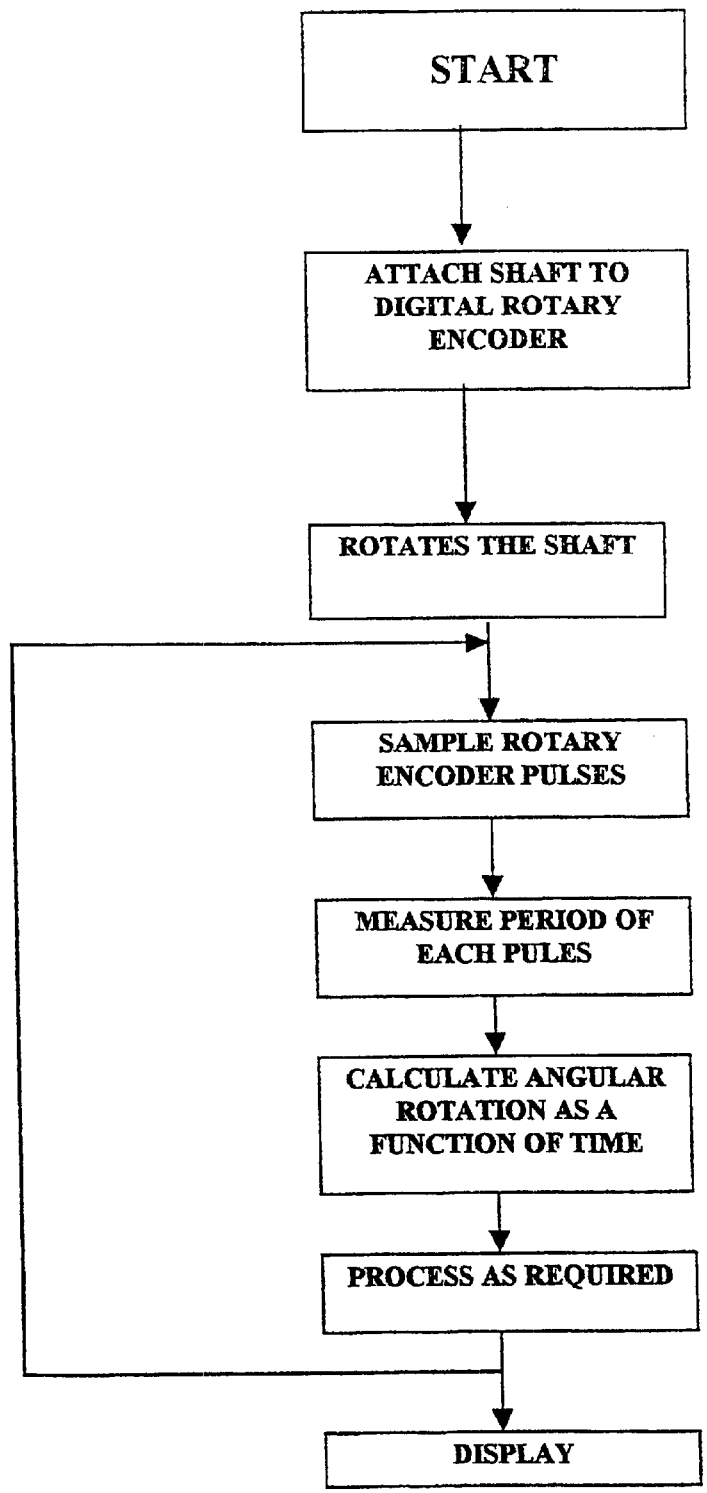
FIG. 4 is a flow diagram showing the principal steps for operating the motor test system shown in FIG. 2.

FIG. 4 is a flow diagram showing the operation of the motor test system 20. Thus, initially the motor 21 is energized and the output of the shaft encoder 23 is sampled as explained above. The sampled data is collected and processed by the computer 25 and the processed data is displayed on the display device 26. Any departure from an accepted performance range is calculated and allows a warning signal to be output by the computer 25 for warning of a faulty motor. Such a warning signal may, of course, be rendered audible or visual in known manner. Optionally, as will be explained in greater detail below, the fluctuations on the transient effects produced during acceleration of the motor 21 may be removed so as to produce the conventional static speed characteristic.

Figure 5:
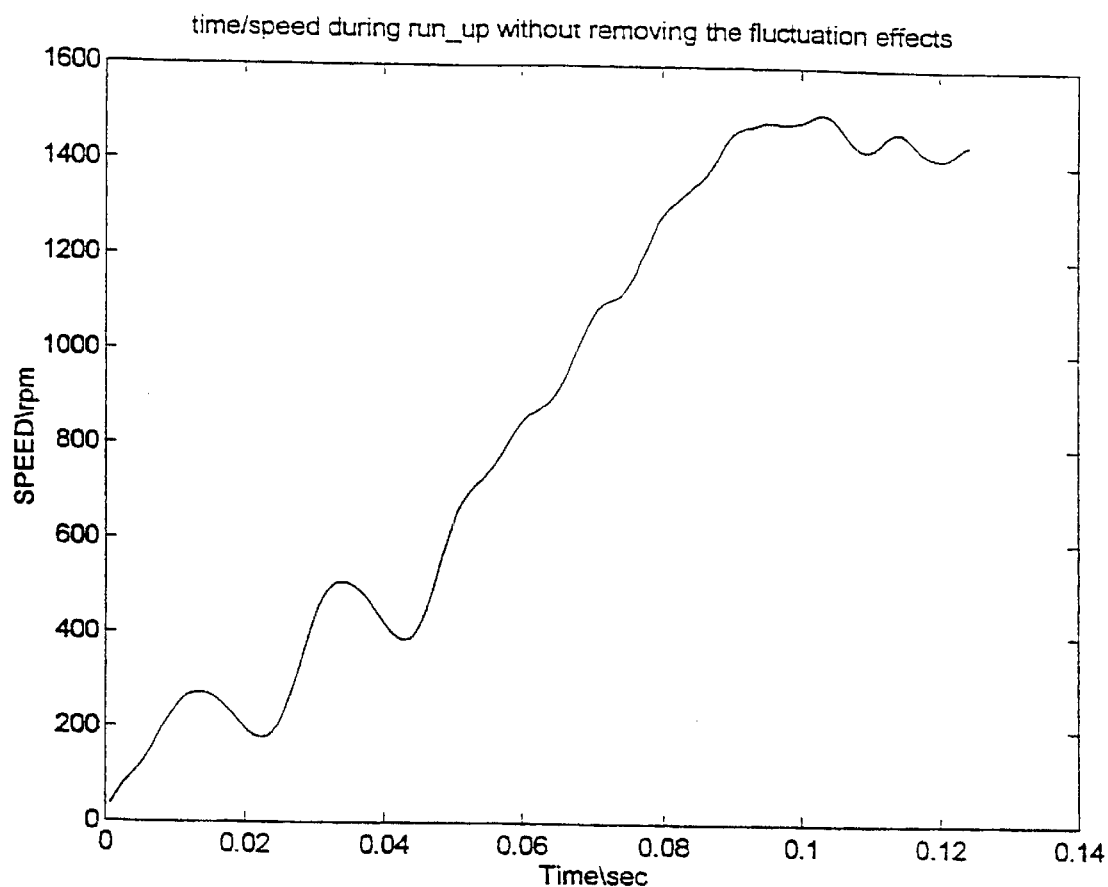
FIGS. 5 to 13 show graphically typical a.c. PSC induction motor characteristics measured or computed with the motor test system according to the invention.

FIG. 5 shows graphically the dynamic motor speed characteristic for an a.c. PSC induction motor as computed from the measured successive time periods of pulses produced by the shaft encoder 23. Thus, the incremental motor speed between successive pulses may be calculated since the angular rotation commensurate with each pulse is known. It is noted that the motor speed and therefore torque do not continually increase with time but, rather, climb and then fall for a short time, whereafter they again climb. After approximately 0.04 s, this effect ceases and the motor speed and torque increase with time until the steady state condition is approached. In particular, it is to be noted that even when the motor reaches steady state, there are still continuous fluctuations in its speed. These fluctuations are only apparent by measuring the angular rotation of the motor as a function of pulse period of the rotary encoder and are missed altogether in hitherto proposed methods based on averaging data over a large number of pulses.

It has already been noted that no flywheel need be connected to the motor 21. Instead, motor torque may be calculated from a knowledge of the moment of inertia of the rotor in accordance with Newton's Law, as follows:

$$M(t) = Q\frac{d\omega}{dt} + L(t) \quad (2)$$

where: M(t)=instantaneous Torque at time t,

Q Moment of Inertia of rotor,

ω=angular speed of motor, and

L(t)=instantaneous external load at time t.

Since no load is connected to the motor 21, L(t) is zero and equation (2) simplifies to:

$$M(t) = Q\frac{d\omega}{dt} \quad (3)$$

Figure 6:
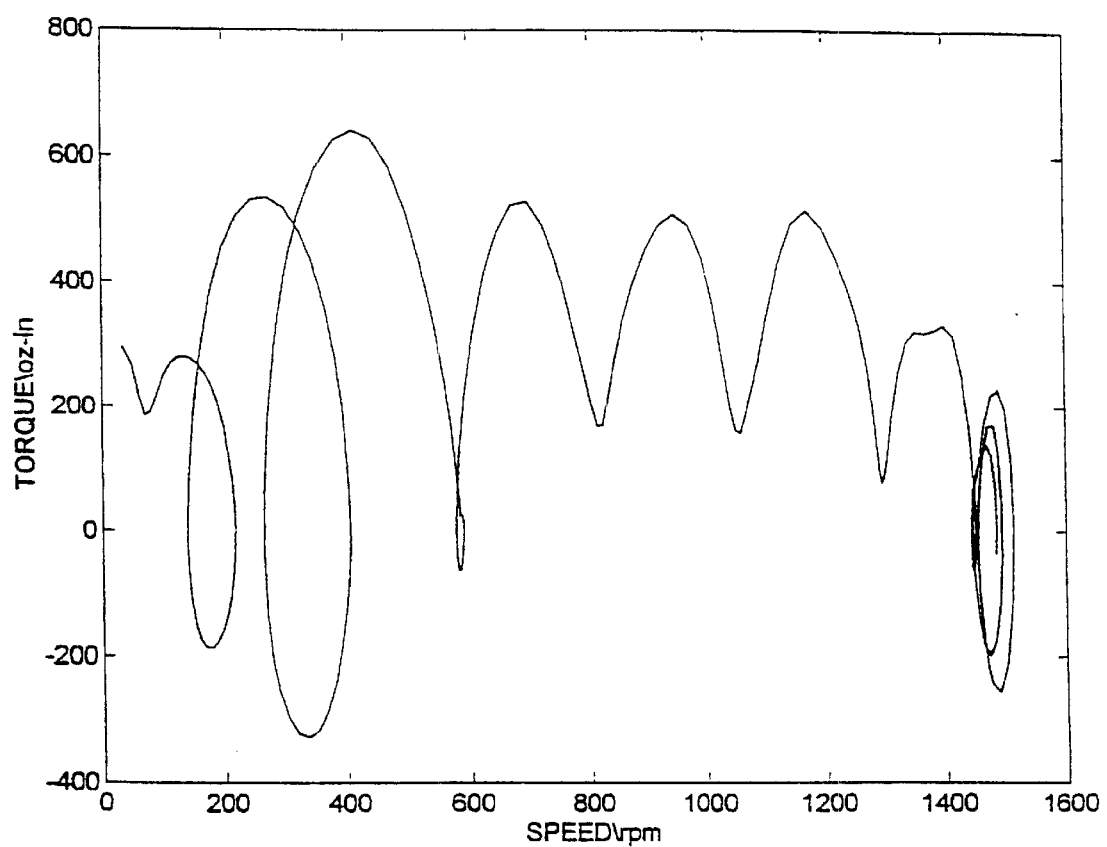

FIG. 6 shows graphically the run-up torque characteristics which are derived from the speed characteristics of the motor 21 as follows. The motor is operated without any external load and the dynamic speed characteristic is derived and stored in the computer 25. The time derivative of the dynamic speed characteristic is then calculated and the result multiplied by the known moment of inertia of the rotor. Seeing that the speed is determined in rpm, the result must be further multiplied by a factor 2π/60 to convert to the equivalent angular speed in radians per second relate to the dynamic torque from starting the unloaded motor to its reaching full speed. This characteristic is repeatable providing that care is taken always to start the motor at a predetermined point in the a.c. cycle of the supply voltage. For example, in a particular system reduced to practice, the motor was started at the point in the a.c. cycle where the voltage climbed through 0 volt.

The run-up no-load torque characteristic of the motor shown in FIG. 6 allows determination of dynamic motor characteristics which are unattainable with conventional systems providing static speed and torque characteristics only. The dynamic characteristics allow identification of motor faults not detectable from static data only as well as permitting classification of motor characteristics. Moreover, it has been found that:

(i) The dynamic torque characteristic gives an indication of the noise amplitude in the motor torque during acceleration thereof; and likewise provides an indication of the strength of mechanical noise in the motor arising from changes in the torque during acceleration;

(ii) The dynamic torque characteristic gives an indication of any imbalance in the rotating parts of the motor;

(iii) The dynamic torque characteristic offers a particularly sensitive diagnostic tool for identifying motor faults.

Figure 7:
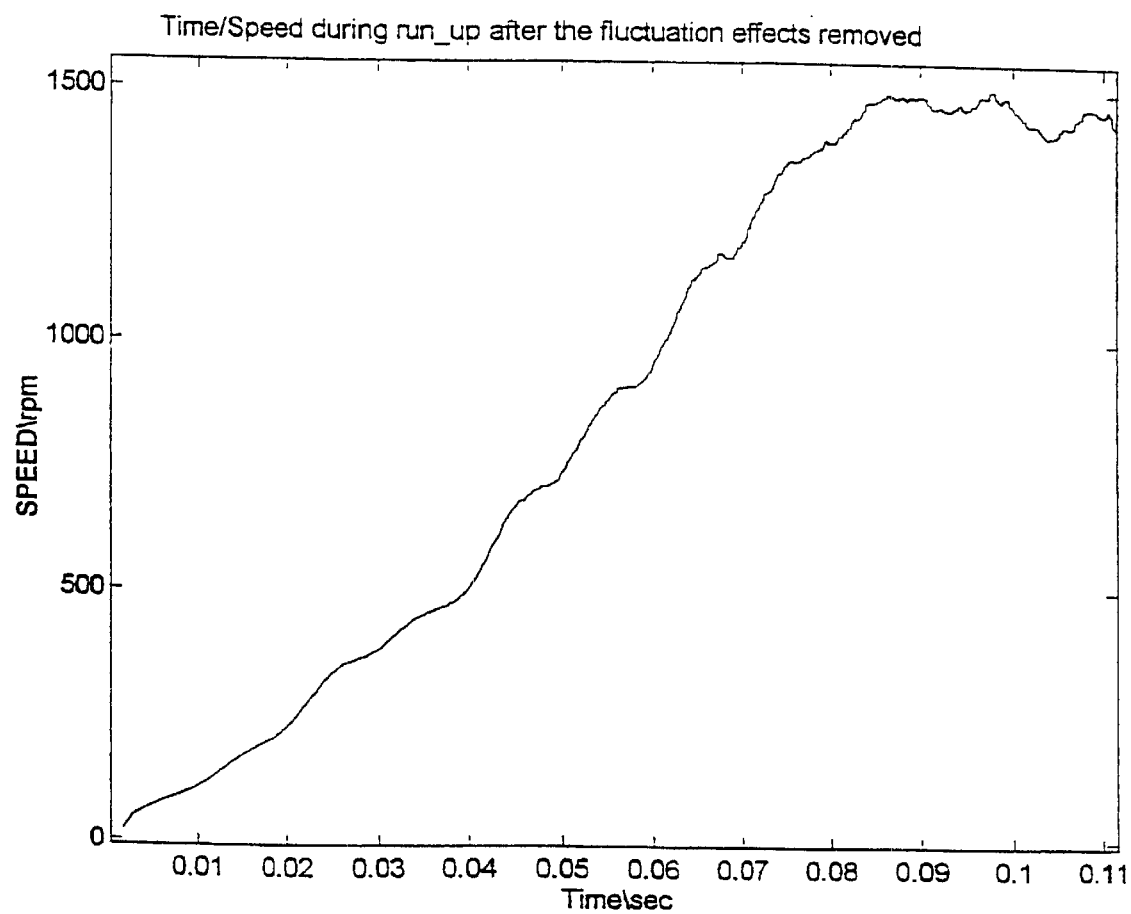

The above discussion has concentrated, so far, on the dynamic characteristics of the motor during run-up. However, if desired fluctuations in the transient effects can be removed so as to provide the smoothed speed-time characteristic shown graphically in FIG. 7, from which may be derived the conventional torque-speed characteristic (shown in FIG. 11). Removal of fluctuations in the transient effects can be achieved in several ways. The motor shaft can be mechanically locked and released only when the stator current achieves a steady state value. Alternatively, if the motor 21 is a Permanent Split Capacitor (PSC) type induction motor wherein the stator comprises a main coil and an auxiliary coil which may be switched in parallel with the main coil, then the rotor will rotate only when current is fed to both coils. Therefore, initially current is fed to the main coil only and the auxiliary coil is switched in circuit only when the currents in the main coil have stabilized. Again, it should be noted that both the main and auxiliary stator coils are switched in circuit only when the a.c. supply voltage equals zero on its upward climb. More generally, repeatability may be ensured by supplying power at any other known angle in the a.c. voltage supply cycle.

Yet another way to neutralize the fluctuations of transients is to process the dynamic speed characteristic of the motor using a suitable algorithm. To this end, the dynamic speed characteristic shown in FIG. 5 is sampled so as to determine changes in speed as a function of time during acceleration of the motor. The resulting signal is Fourier transformed from the time domain to the frequency domain so as to derive the frequency spectrum. The frequency spectrum is filtered so as to remove the higher frequency harmonics and the resulting spectrum is transformed back to the time domain. In this connection it should be noted that obtaining the frequency spectrum is rendered possible by virtue of the fact that the time resolution is sufficiently high in the time domain. Hitherto-proposed methods employing coarse time resolution are not capable of resolving the frequency spectrum.

Yet another approach to canceling the fluctuations in the transient effects of the stator current is to rotate the shaft in an opposite direction to the normal rotation direction and then, during time that the motor changes direction, commencing sampling of the acceleration (i.e. speed-time) characteristics. Such a technique is well known and is described, for example, in U.S. Pat. No. 5,440,915 also assigned to Automation Technology, Inc. and entitled "A Method and Apparatus for Me Friction Torque". The subsequent processing is similar to that described above for deriving the dynamic speed characteristic, but produces the static speed characteristic since the tent component is no longer present.

Figure 8:
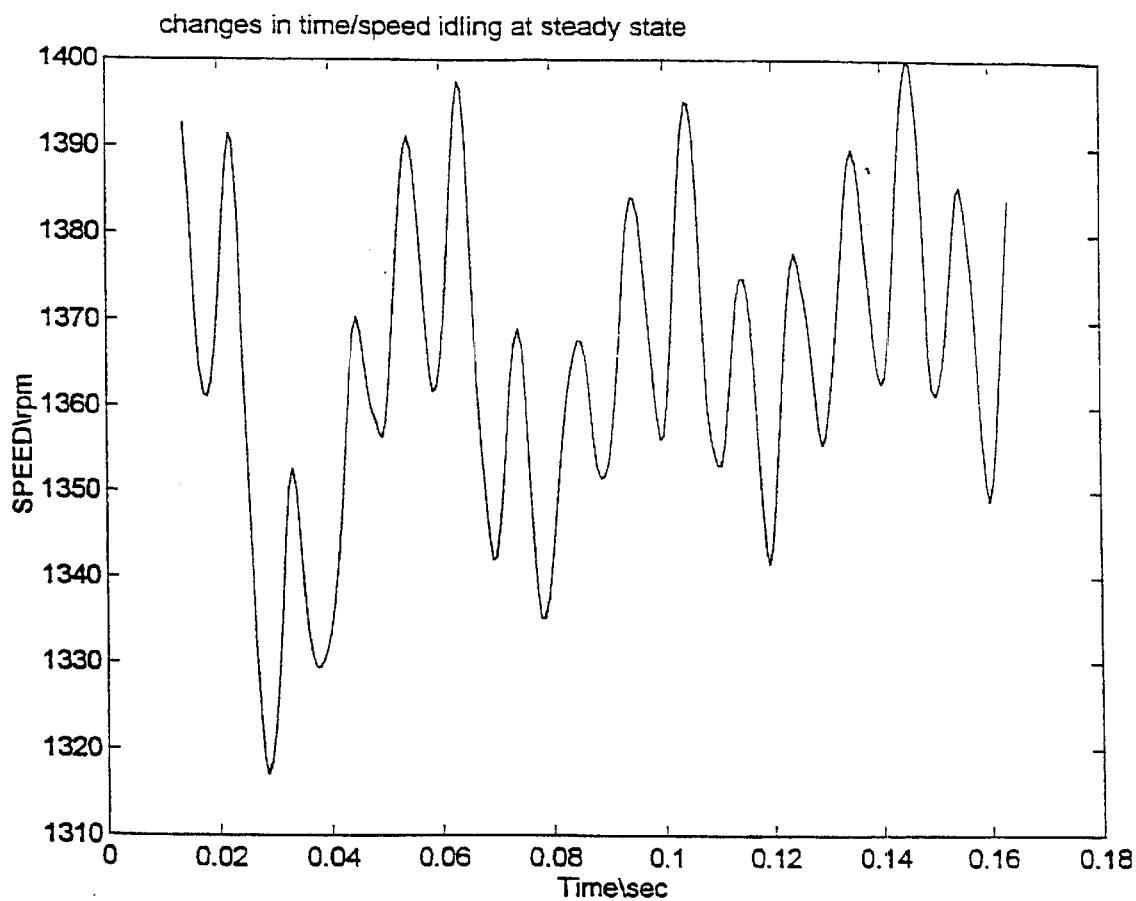
Figure 9:
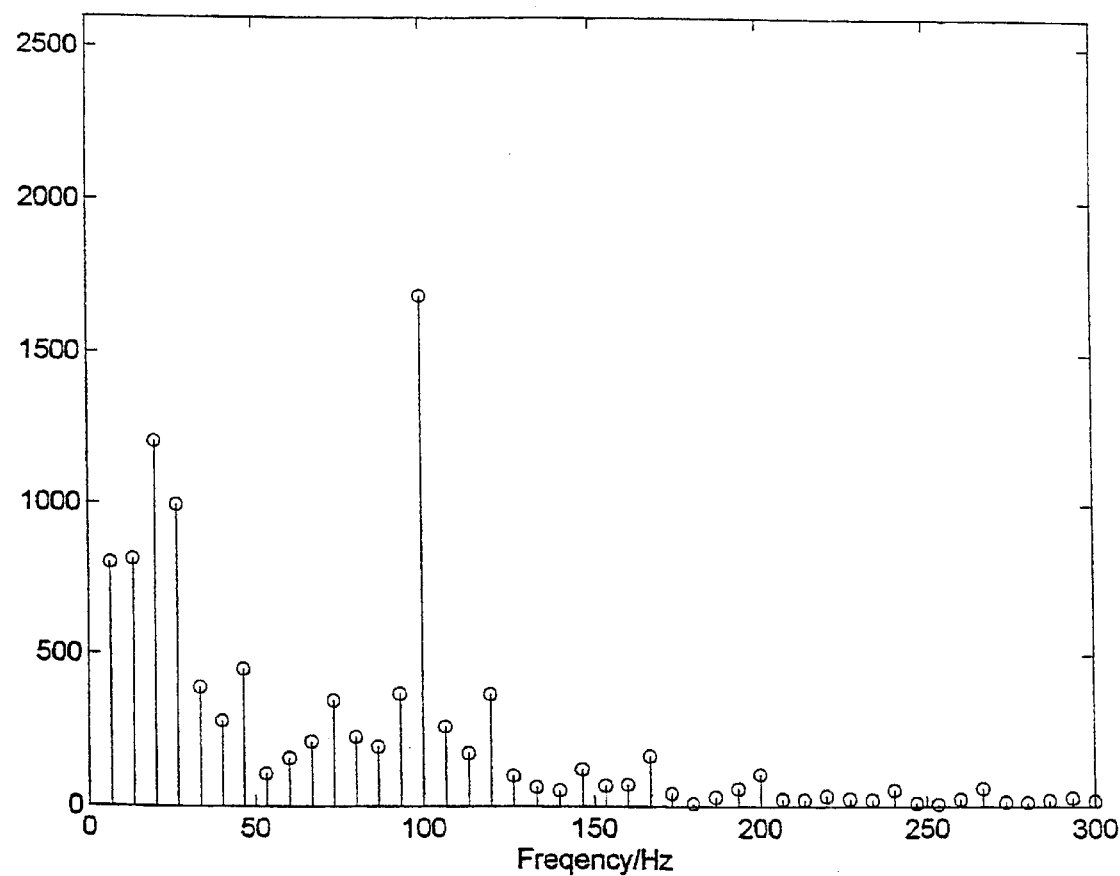

FIG. 8 shows graphically the change in speed for an unloaded 4-pole PSC induction motor idling at steady state. FIG. 9 shows the result of transforming the speed characteristics of the motor to the frequency domain. The frequency spectrum shown in FIG. 9 provides clearer information regarding the motor than may be resolved in the time domain. Specifically, clearer information is derived regarding torque and speed fluctuations.

The moment of inertia of the rotor may be determined by deriving two separate speed characteristics: one for the unloaded motor, and the other wherein a known inertial load is applied to the motor shaft. Thus, the following sums are performed:

(i) deriving the speed-time characteristic of the unloaded motor and eliminating the effects of fluctuations in he transients thereof (ii) couple to the motor an inertial load of known moment of inertia, (iii) deriving the speed-time characteristic of the loaded motor and eliminating the effects of fluctuation in the transients thereof, and (iv) processing the respective speed characteristics derived in (i) and (iii) so as to determine the moment of inertia of the rotor. The calculations are based on the following equations:

For the Unloaded Motor $$M_{\max} = Q \cdot \left(\frac{d\omega}{dt}\right)_{\max_1} \quad (4)$$

where: $M_{max}$ is the maximum motor torque,

Q is the moment of inertia of the motor's rotor (to be calculated), and

ω is the angular velocity of the motor.

For the Motor Loaded with a known Inertial Load $\theta_1$ $$M_{\max} = (Q + Q_1) \cdot \left(\frac{d\omega}{dt}\right)_{\max_2} \quad (5)$$

The maximum motor torque ($M_{max}$) is constant and independent of any load applied thereto. Therefore:

$$Q \cdot \left(\frac{d\omega}{dt}\right)_{\max_2} = (Q + Q_1) \cdot \left(\frac{d\omega}{dt}\right)_{\max_1} \quad (6)$$

from which it can be derived that:

$$Q = \frac{\left(\frac{d\omega}{dt}\right)_{\max_2}}{\left(\frac{d\omega}{dt}\right)_{\max_1} - \left(\frac{d\omega}{dt}\right)_{\max_2}} \cdot Q_1 \quad (7)$$

The motor test system 10 also allows derivation of the ripple torque of the motor when idling, i.e. under no-load steady-state conditions. For example, an indication of the magnitude of the strength of magnetic noise created by an a.c. PSC induction motor when idling, may be thus determined. During idling, the motor runs at a basically constant speed having superimposed thereon a slight ripple on account of the changing torques created by the varying rotating magnetic field.

Figure 10:
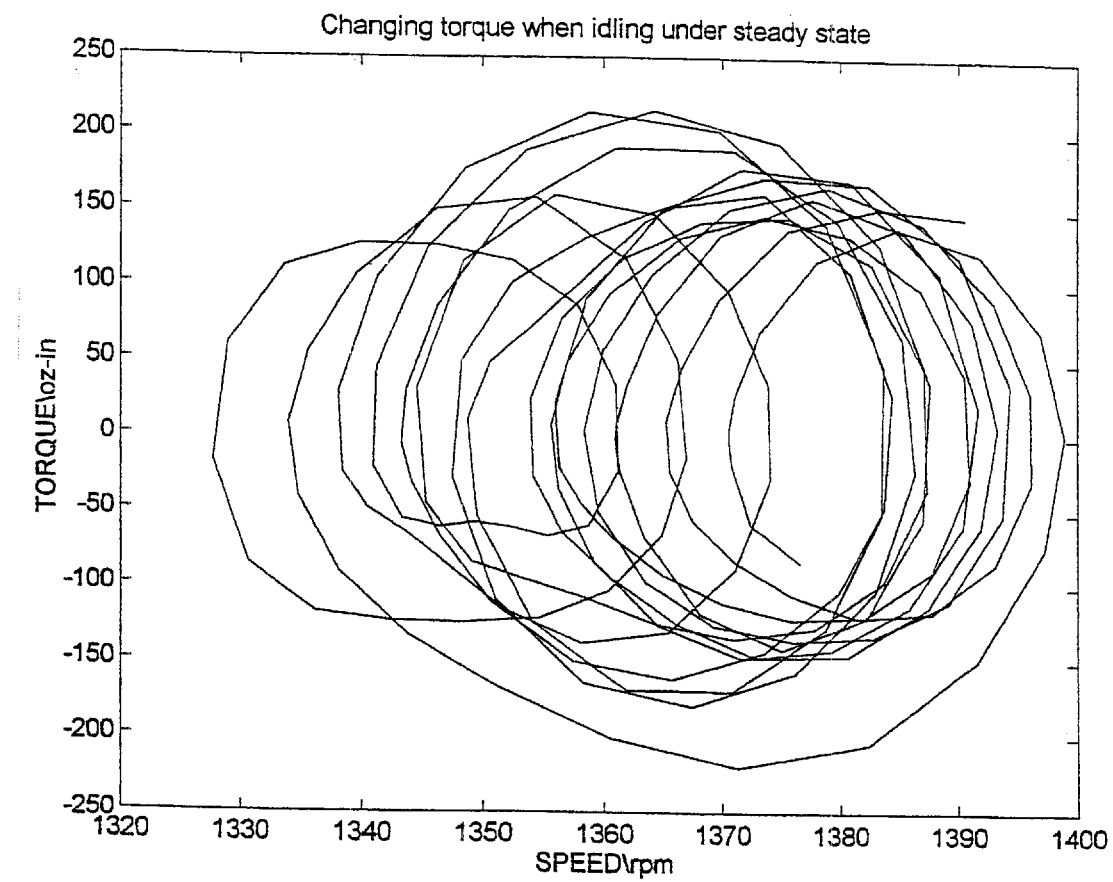

FIG. 10 shows graphically the product of the time derivative of the speed-time characteristic with the moment of inertia of the rotor indicative of the strength of the changing torque created by the motor when idling under steady state conditions.

The motor test system 10 also allows derivation of the varying torque of the loaded motor at working speed giving, for example, an indication of the magnitude of the strength of magnetic noise created by the motor when running at working speed. Likewise, this provides an indication of the magnitude of the strength of mechanical noise resulting from impacts against the load resulting from variations in motor torque. The speed of the motor and applied load vary owing to the variations in torque arising from:

(i) the motor, (ii) the load, and (iii) poor coupling between the two.

The product of the time derivative of the speed characteristic with the moment of inertia of the rotor added to that of the external load gives an indication of the strength of the changing torque created by the loaded motor when running at working speed. The varying torque also provides an indication of the magnitude of the strength of electrical and mechanical noise at working conditions of the loaded motor.

Figure 11:
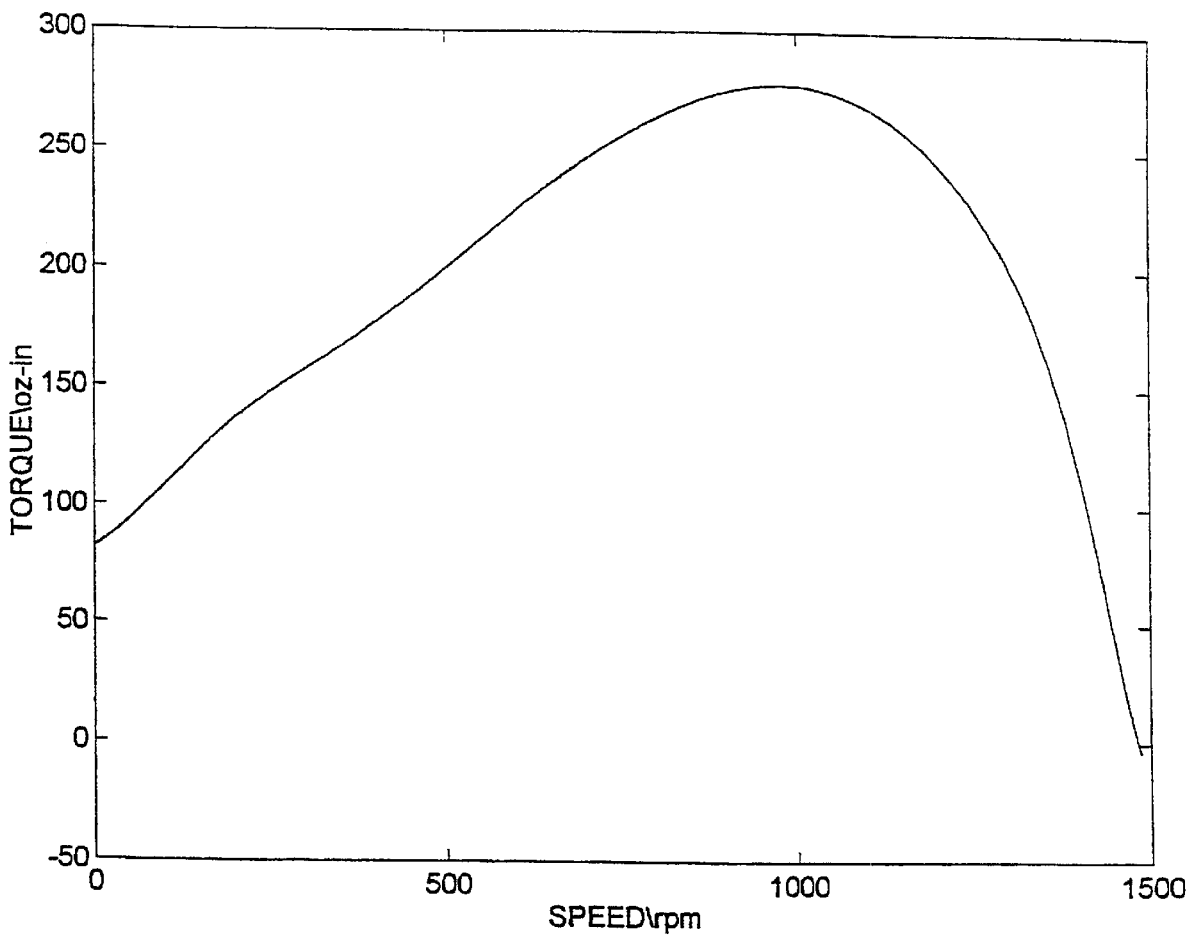

FIG. 11 shows graphically the static torque-speed characteristic of the unloaded motor. At the end of every production cycle, an external load is coupled to the motor and the speed-time characteristics of the loaded motor is determined. The time derivative of this curve, after removal of transient effects, and subsequent multiplication by the total moment of inertia of the rotor and external load together gives the static torque-speed characteristic of the motor less the load. This can be shown as follows:

$$M = (Q_1 + Q_L)\frac{d\omega}{dt} + M_L \quad (8)$$

where: M is the unloaded motor torque, $Q_1$ is the moment of inertia of the rotor, $Q_L$ is the moment of inertia of the external load, and $M_L$ is the load torque.

Figure 12:
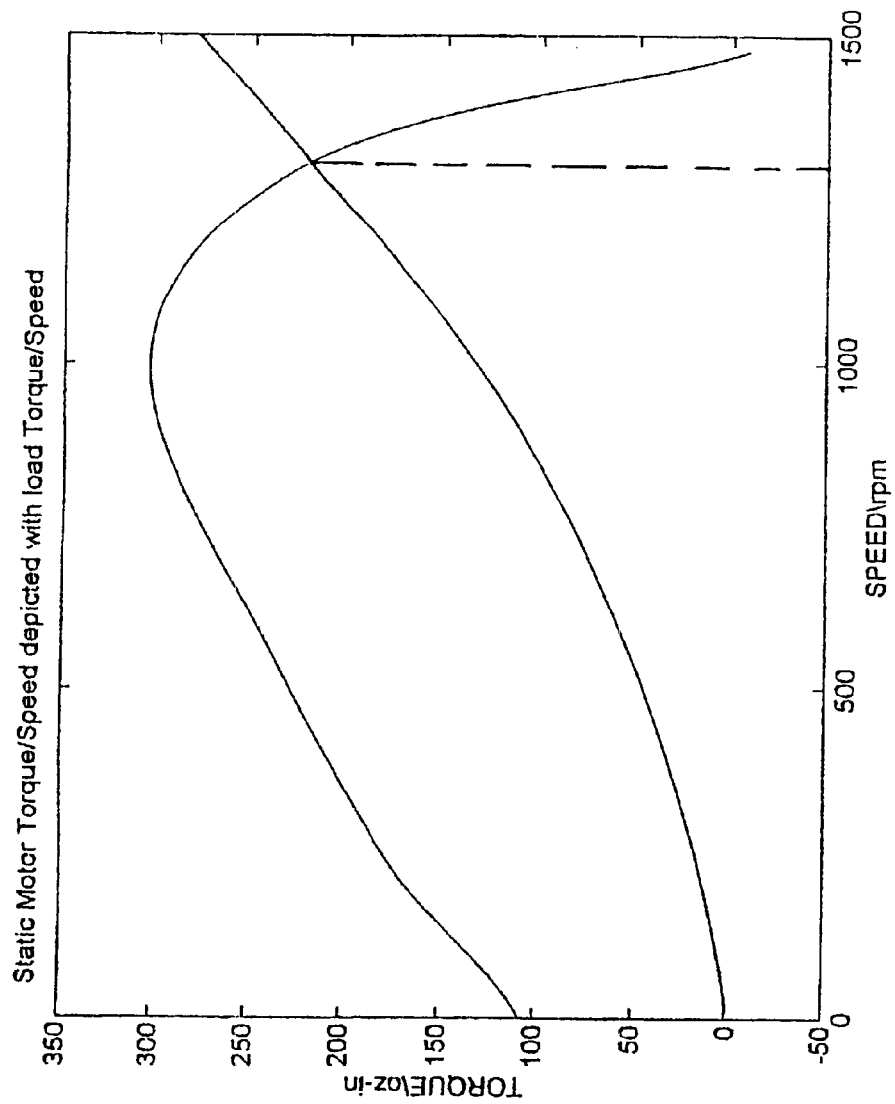
Figure 13:
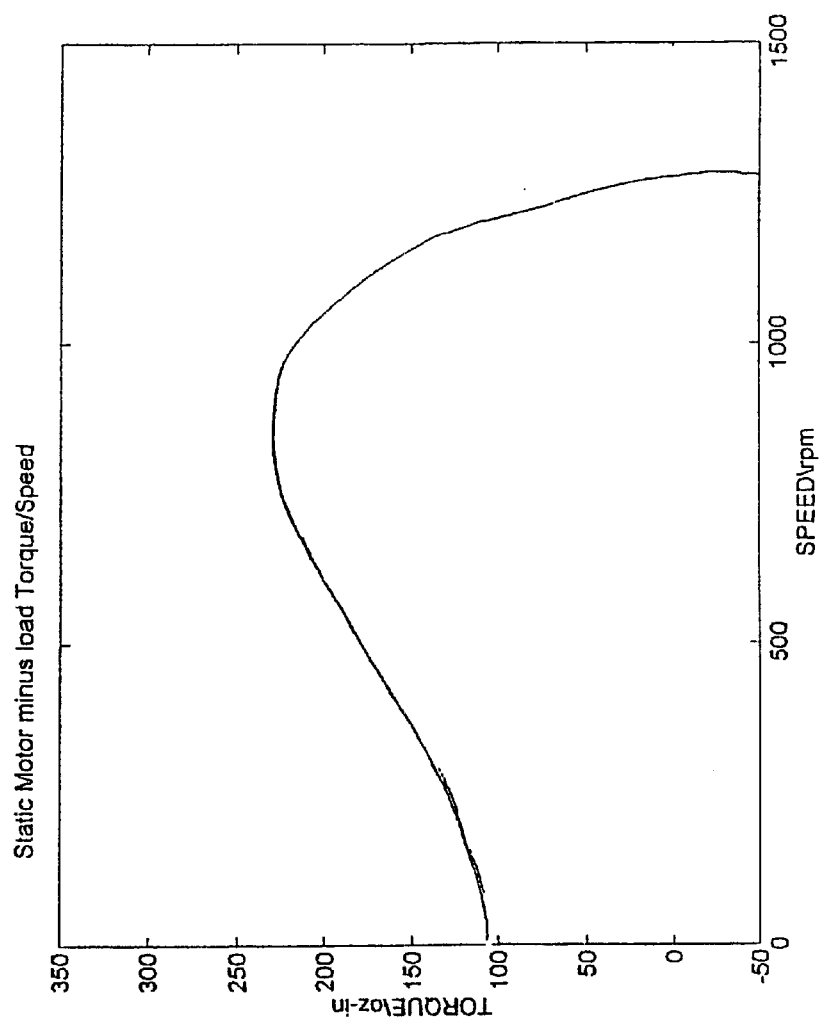

FIG. 12 shows graphically the static torque-speed characteristic depicted in FIG. 11 together with the speed-torque characteristic of the load, $M_L$, being an air-conditioner fan. For such a load, the speed-torque characteristic is generally parabolic in shape, passes through the origin and intersects the motor torque-speed characteristic at the actual working speed of the motor. FIG. 13 plots the difference between motor torque-speed characteristic shown in FIG. 11 and the torque-speed characteristic of the load shown in FIG. 12 so as to derive:

$$M - M_L = (Q_1 + Q_L)\frac{d\omega}{dt} \quad (9)$$

The graph shown in FIG. 13 is derived during acceleration of the motor from startup to its full working speed under load. This characteristic is repeatable in respect of like loaded motors providing that the motor is started from the same point in the a.c. cycle of the supply voltage. For example, in a particular system reduced to practice, the motor was started at the point in the a.c. cycle where the voltage climbed through 0 volt. Thus, the characteristic shown in FIG. 13 serves as an excellent tool for effecting a GO-NOGO test of a batch of similar loaded motors, so as to indicate which motor-load couples (air conditioner, water pumps, etc.) meet the design specification It should be noted that no previous use of the characteristic shown in FIG. 13 is known for establishing the functionality of a loaded machine.

Having computed the loaded motor torque-speed characteristic shown in FIG. 13, the static torque-speed characteristic of the motor shown in FIGS. 11 and 12 may be subtracted in order to derive the torque-speed characteristic of the load shown graphically in FIG. 12.

The run-up state torque-speed characteristic of the loaded motor before the removal of fluctuations on the transient part of the characteristic has a generally similar shape to that of the unloaded motor as shown in FIG. 6 and is derived as follows. The dynamic speed characteristic is derived directly as explained above and its time derivative is computed. Multiplication of the time derivative by the total moment of inertia of the rotor and external load together gives the dynamic torque-speed characteristic of the motor less the load, as is clear from equation (9). Thus, this characteristic serves as an excellent tool for comparing the dynamic performance of a batch of similar motors.

It should be noted that no previous use of this characteristic is known for establishing the functionality of a loaded machine and for obtaining an indication of the magnetic noise of the motor plus load during acceleration from startup. Likewise, no prior use of this characteristic is known for obtaining an indication of mechanical noise resulting from variations in torque acceleration from startup.

During normal working conditions of the loaded motor, the motor and load move at a speed which varies slightly owing to variations in torque arising from:

(i) the motor, (ii) the load, and (iii) poor coupling between the two.

The product of the time derivative of the speed characteristic with the moment of inertia of the rotor added to that of the external load gives an indication of the strength of the changing torque created by the loaded motor when running at working speed. The varying torque also provides an indication of the magnitude of the strength of electrical and mechanical noise at working conditions of the loaded motor.

Most of the tests described above relate to the complete motor, either loaded or unloaded. However, the invention also contemplates the testing of components of a machine by comparison to a nominal "ideal" machine. For example, in order to test different rotors, a pre-calibrated, high performance stator is used and the above tests may be performed so as to derive both the static and dynamic performance of the motor. By repeating these tests in respect of the same motor using different rotors, the performance of the rotors may be compared. Likewise, by employing a pre-calibrated, high performance rotor and substituting different stators, the performance of the stators may be compared.

So far, the methods which have been described relate to the measurement of the transient part of the speed-time or speed-torque characteristics, from start-up of the machine until steady sate is reached. Thus, by measuring the actual time of each pulse, it has been demonstrated that the speed-time or speed-torque characteristics can be determined with much finer resolution than can be resolved by measuring the average rotation in a fixed time period. As a result, fluctuations which occur during the transient part of the motor characteristics can also be resolved, thus providing information regarding motor performance which has eluded hitherto proposed approaches.

It has also been explained that, even when the unloaded machine reaches steady state, the nominally constant speed or torque is also subjected to perturbations or ripple which become measurable when the characteristics are determined according to the invention.

However, it has been found by the inventor that, even when the loaded machine reaches steady state under actual working conditions, the nominally constant speed or torque is also subjected to perturbations or ripple which become measurable when the characteristics are determined according to the invention. This, too, provides invaluable information which is completely lost when the speed-time or speed-torque characteristics are derived using conventional methods. In this case, of course, there is no need to measure the speed of the machine from startup and it is no longer relevant to know, for an a.c. machine, when in the a.c. voltage cycle power was supplied to the machine. All that is required is to measure the speed-time characteristic of the machine after reaching steady state in real time, in order to derive what is, in effect, a real time dynamic speed-time characteristic of the machine at steady state. The nominally constant speed is found to have a dynamic ripple component which serves as a valuable indicator of the performance of the motor and applied load. Specifically, too much ripple is indicative of a working motor which is improperly functioning and therefore the amount of ripple serves as a yardstick as to whether the performance of the working motor is acceptable or not. Therefore, by constantly monitoring the steady state performance of the loaded motor under working conditions and comparing the magnitude of the ripple component to a predetermined threshold, a warning can be given in the event that the loaded motor or any component thereof does not meet the design specification.

Figure 14:
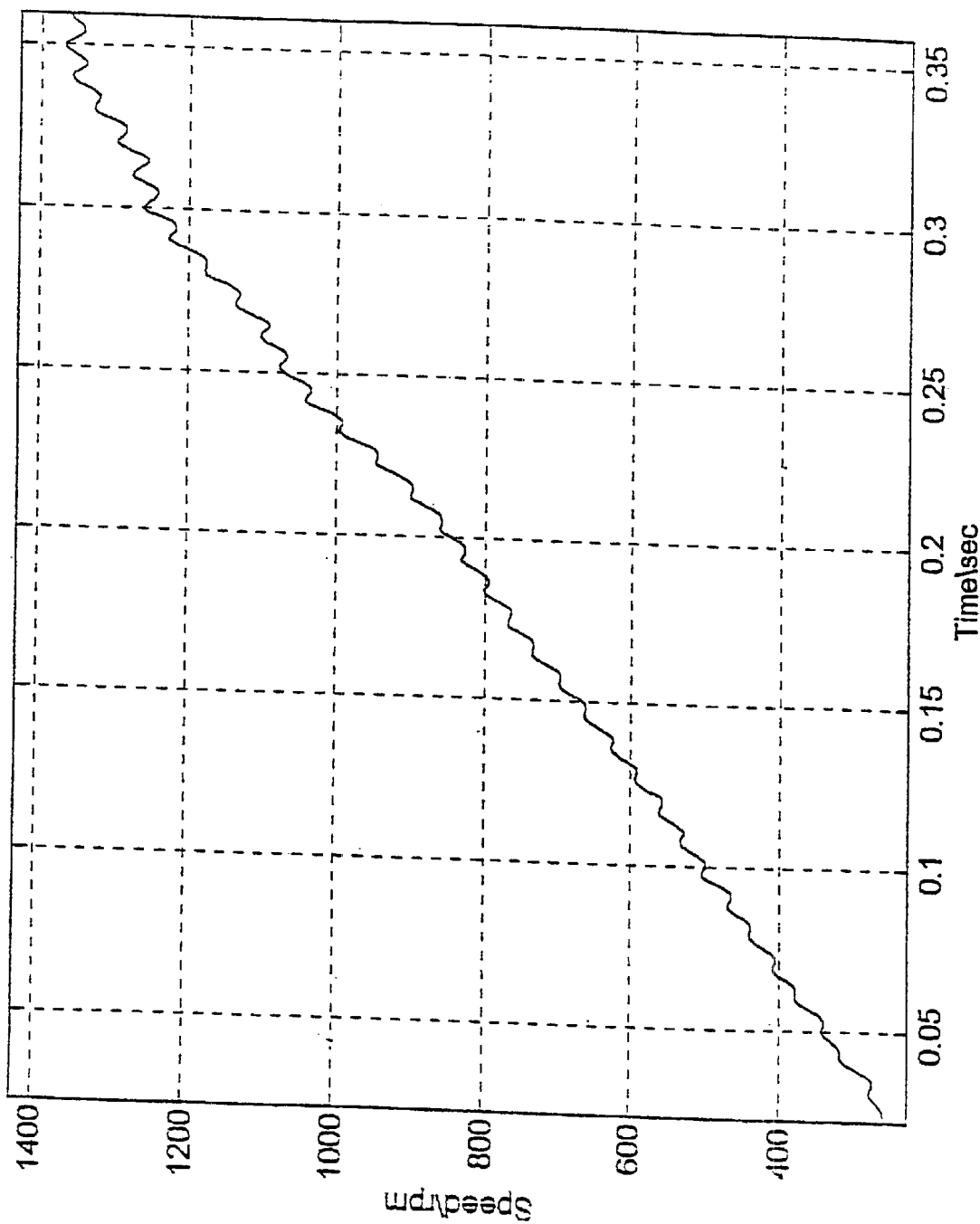
FIGS. 14 to 19 show graphically further applications of the invention for highlighting faults on steady state condition.

The invention also allows measurement of oscillating torque and speed during steady state condition so as to derive speed-time and torque-time characteristics in both the time and frequency domains. In such case, it is possible either to wait until the rotating shaft has reached to its steady state speed or, alternatively, to couple a high inertia flywheel to the rotating shaft so as deliberately to slow down the time to reach steady-state. In such case, steady state oscillating torque and speed phenomena will appear during the acceleration, these being discernible owing to the fact that many more sampling points are available than in hitherto-proposed test beds. It has been found that the dynamic ripple highlights faults with the machine that would not otherwise be apparent FIG. 14 shows the speed-time characteristics of a motor when a flywheel having a high moment of inertia is coupled to its shaft. The motor speed climbs slowly from zero reaching idling speed after approximately 0.35 sec as against 0.1 sec without the flywheel. It will be noticed that superimposed on the steady state speed-time characteristics are oscillations depicted small changes in the steady state speed of the motor. These are always present but are unnoticeable when the motor speed rises to steady state speed quickly.

Figure 15:
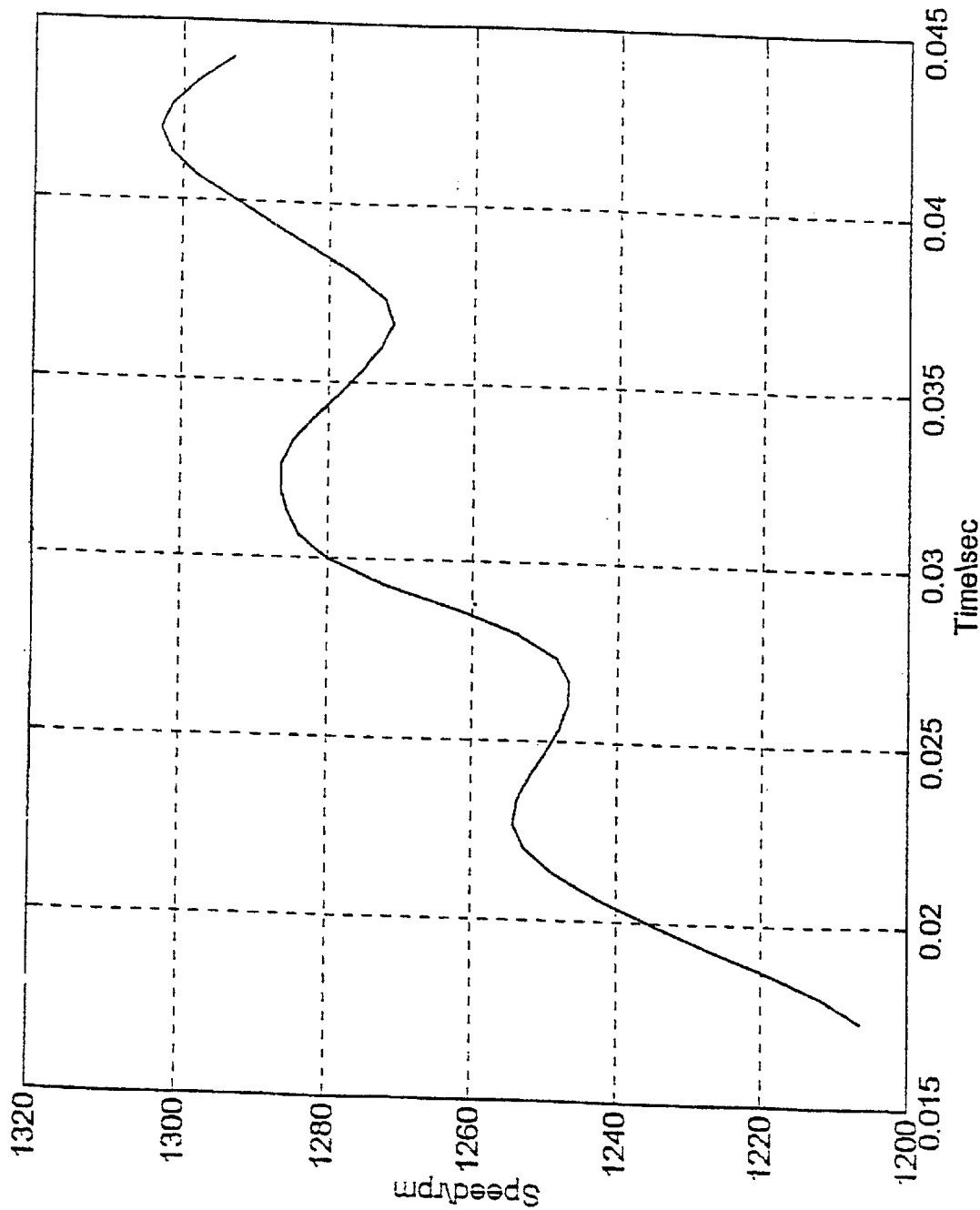

FIG. 15 shows the effect of zooming the motor speed-time characteristics shown in FIG. 14 centered at a speed of 1,260 rpm, showing more clearly the periodic rise and fall in steady-state motor speed. This curve serves as a yardstick for categorizing steady-state performance of a loaded motor at a speed of 1,260 rpm.

Figure 16:
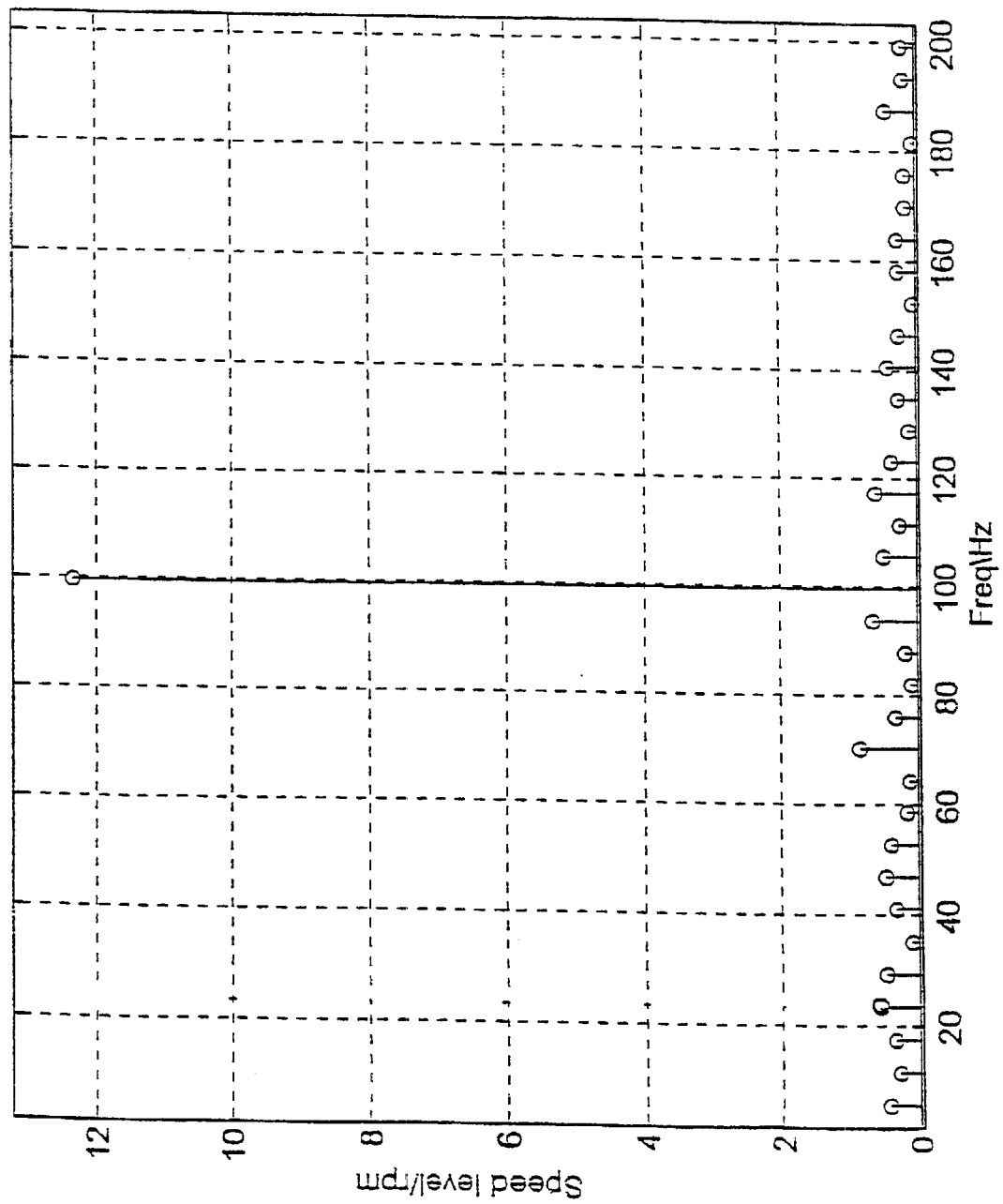

FIG. 16 shows the speed spectrum derived from the speed-time characteristics shown in FIG. 15 centered around a speed of 1,260 rpm. It will be noticed that the speed spectrum indicates a fundamental frequency of 100 Hz, this corresponding to twice the frequency of the a.c. supply.

Figure 17:
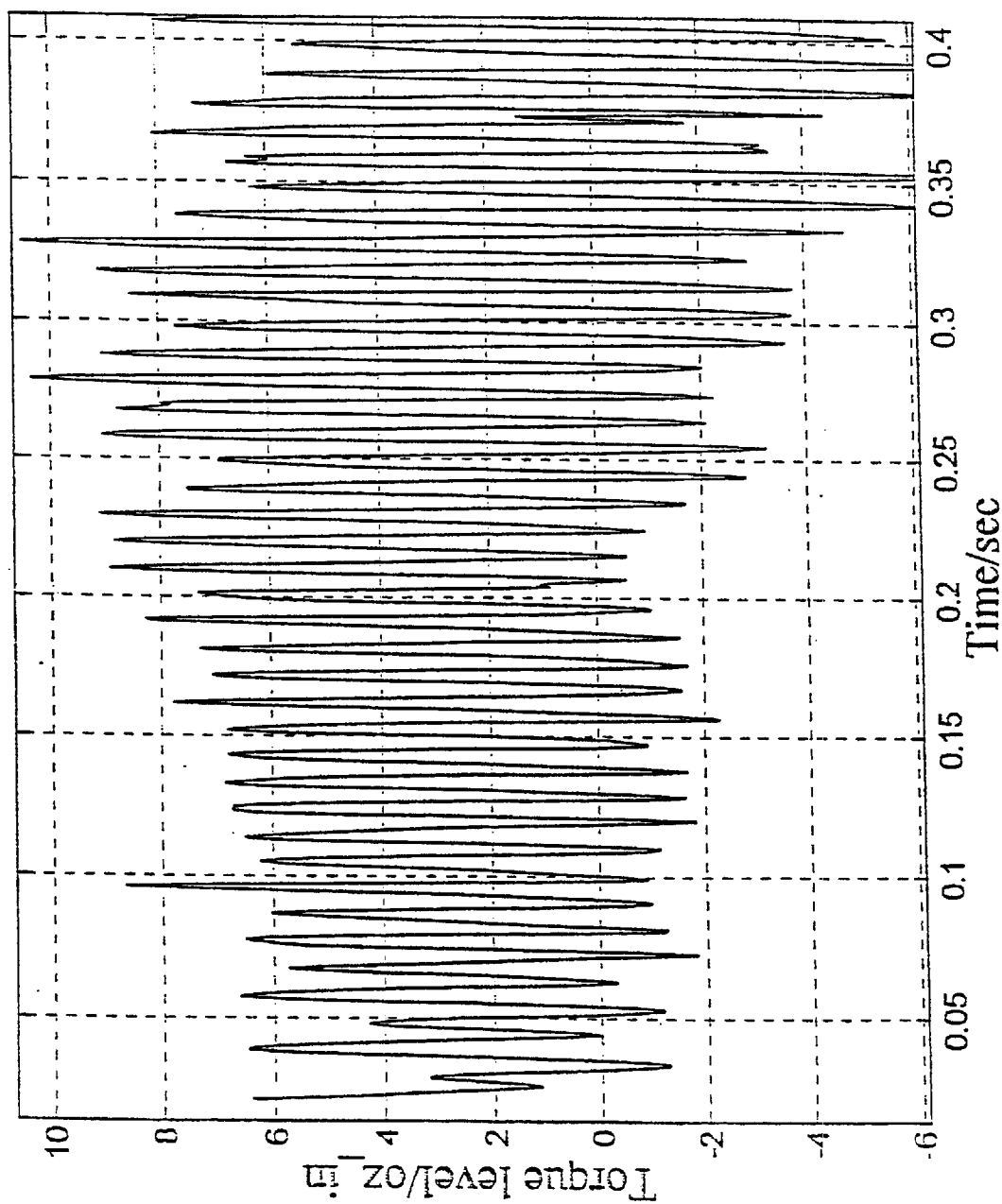

FIG. 17 shows the torque-time characteristics derived by differentiating the speed-time characteristics shown in FIG. 14 with respect to time and multiplying by the combined moment of inertia of the flywheel and motor. The figure shows similar oscillations in torque as are observed in the speed-time curve of FIG. 14.

Figure 18:
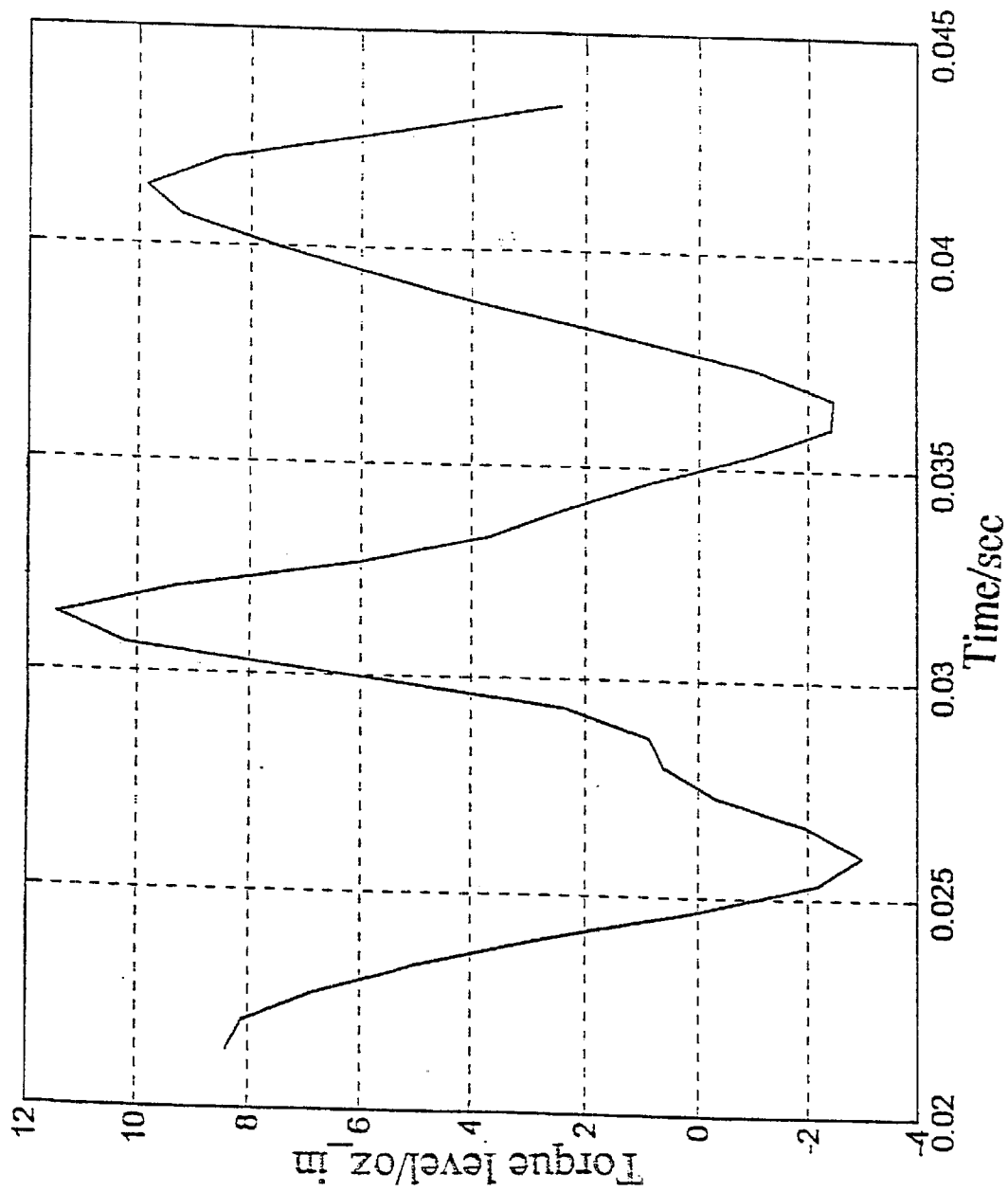

FIG. 18 shows the effect of zooming the motor torque-time characteristics shown in FIG. 17 centered at a speed of 1,260 rpm, showing more clearly the periodic rise and fall in steady-state motor torque. As seen from FIG. 14, the motor reaches a speed of 1,260 rpm at time t=0.3 sec. FIG. 18 is thus derived by zooming in on the motor torque-time characteristics centered around t=0.3 sec. This curve serves as a yardstick for categorizing steady-state performance of a loaded motor at a speed of 1,260 rpm.

Figure 19:
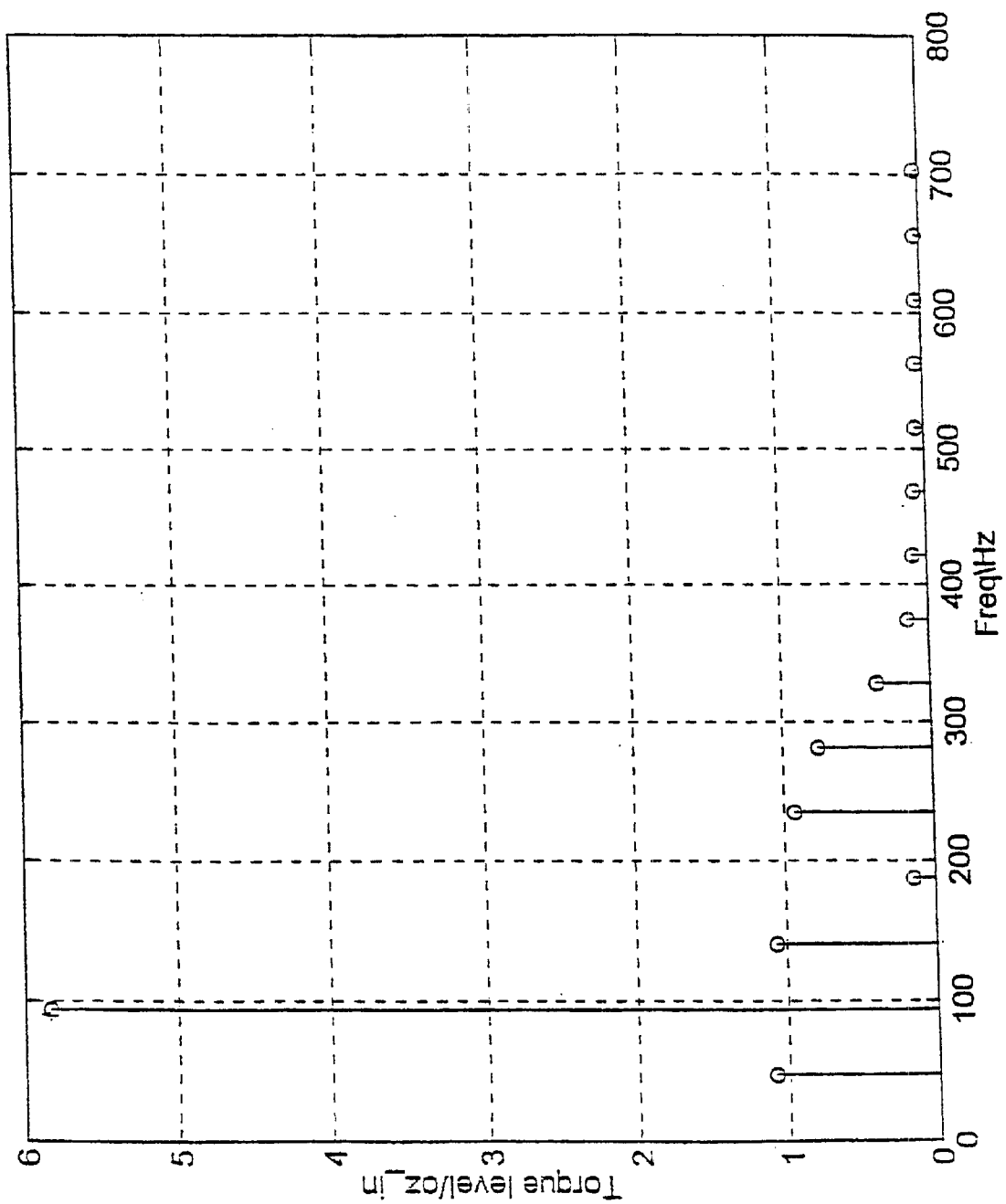

FIG. 19 shows the torque spectrum derived from the torque-time characteristics shown in FIG. 18 centered around a speed of 1,260 rpm. It will again be noticed that the torque spectrum indicates a fundamental frequency of 100 Hz, this corresponding to twice the frequency of the a.c. supply.

Figure 20:
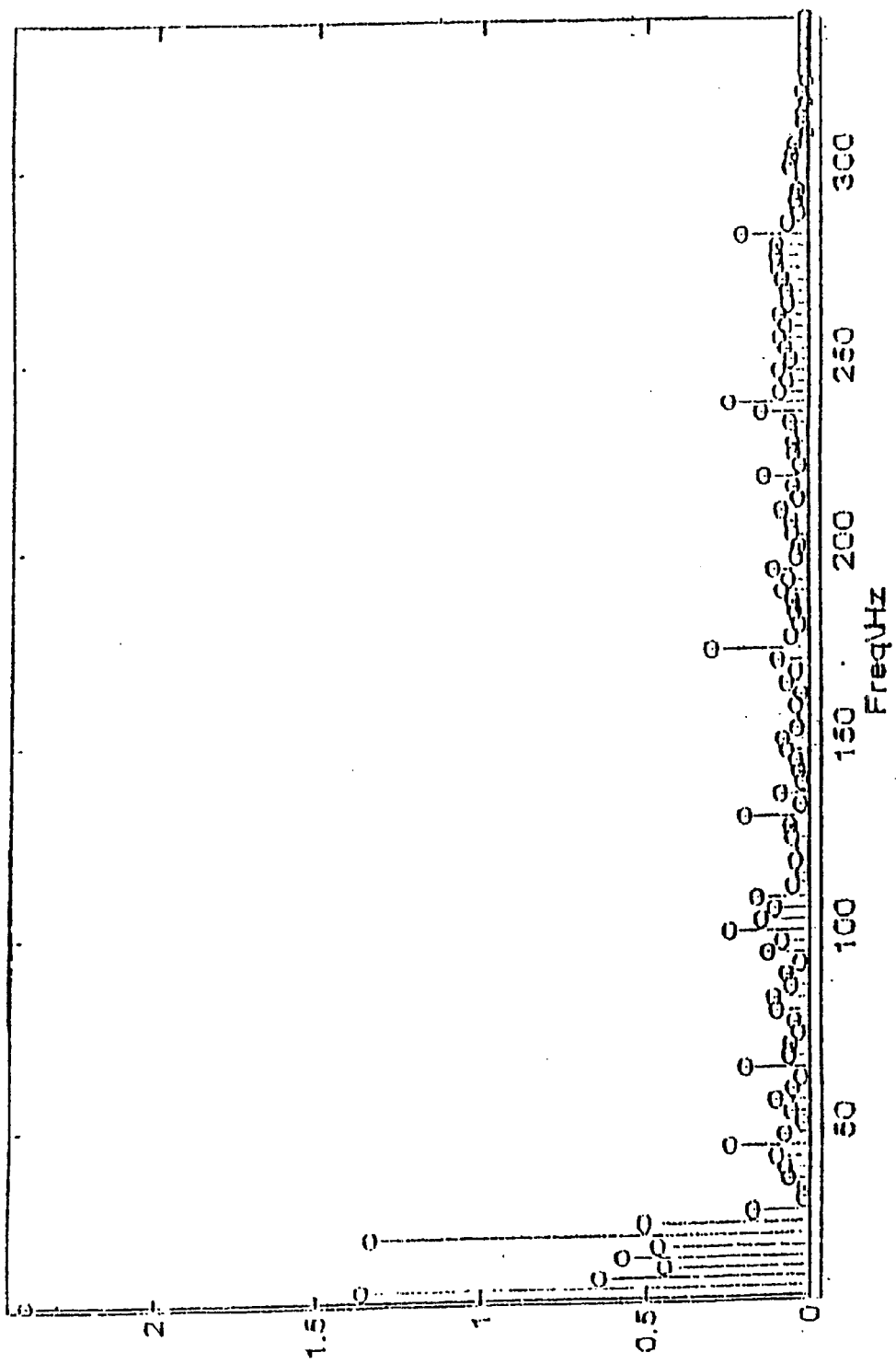
FIGS. 20 to 23 show graphically further applications of the invention for highlighting faults with an air-conditioning fan.

FIG. 20 the steady state frequency speed spectrum curve for an air conditioner displaying a gust problem, which manifests itself as a large 3 Hz component.

Figure 21:
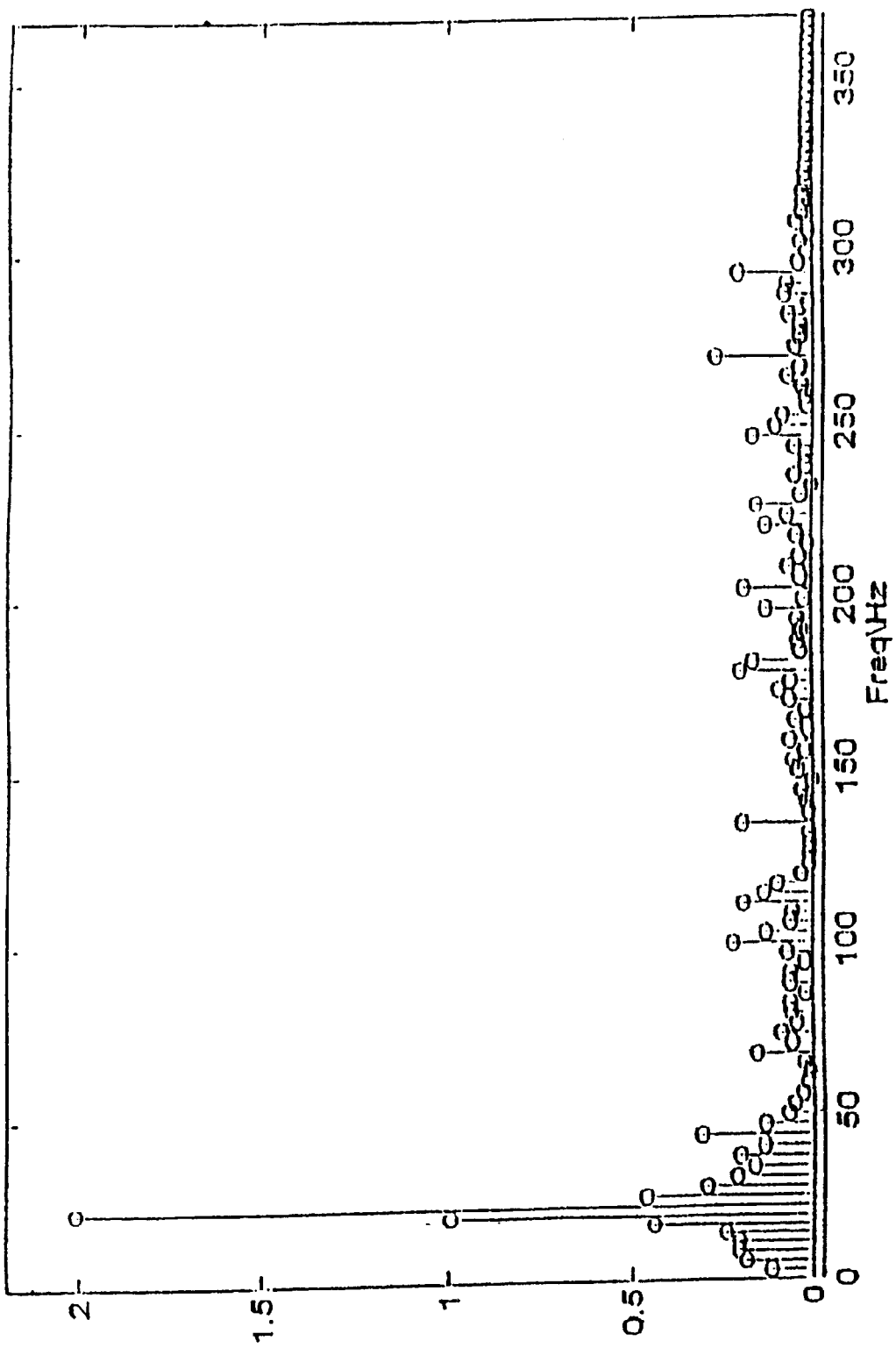

FIG. 21 shows the steady state frequency speed spectrum curve for a good air conditioner showing a small 3 Hz component.

Figure 22:
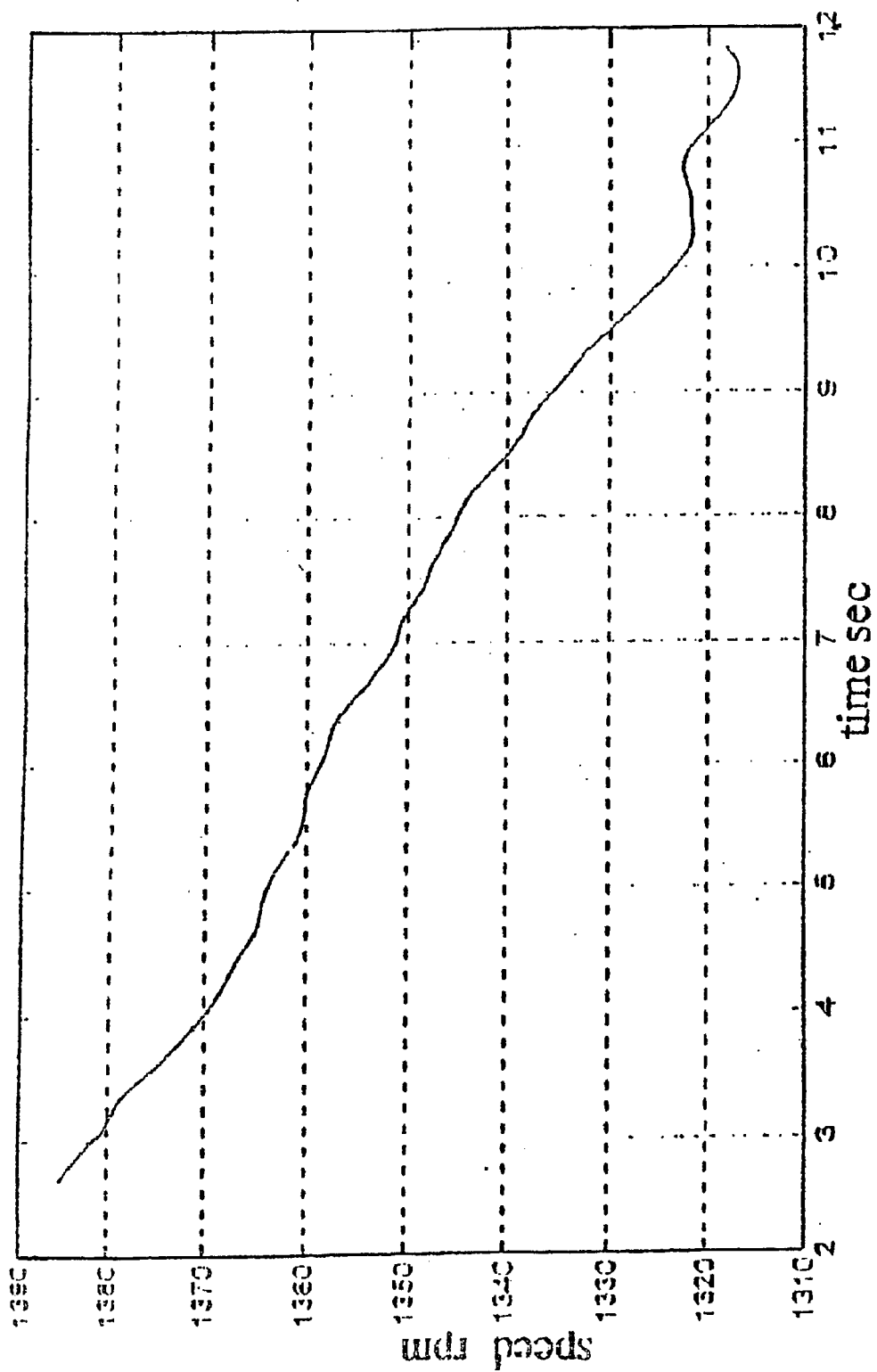

FIG. 22 shows the regular steady state speed time characteristic for an air conditioner produced by repeatedly adjusting the shutter and deriving and displaying the speed-time characteristic of the fan for different shutter positions. This shows that fluctuations in the speed of the fan are small, indicative of high quality performance of the air conditioner.

Figure 23:
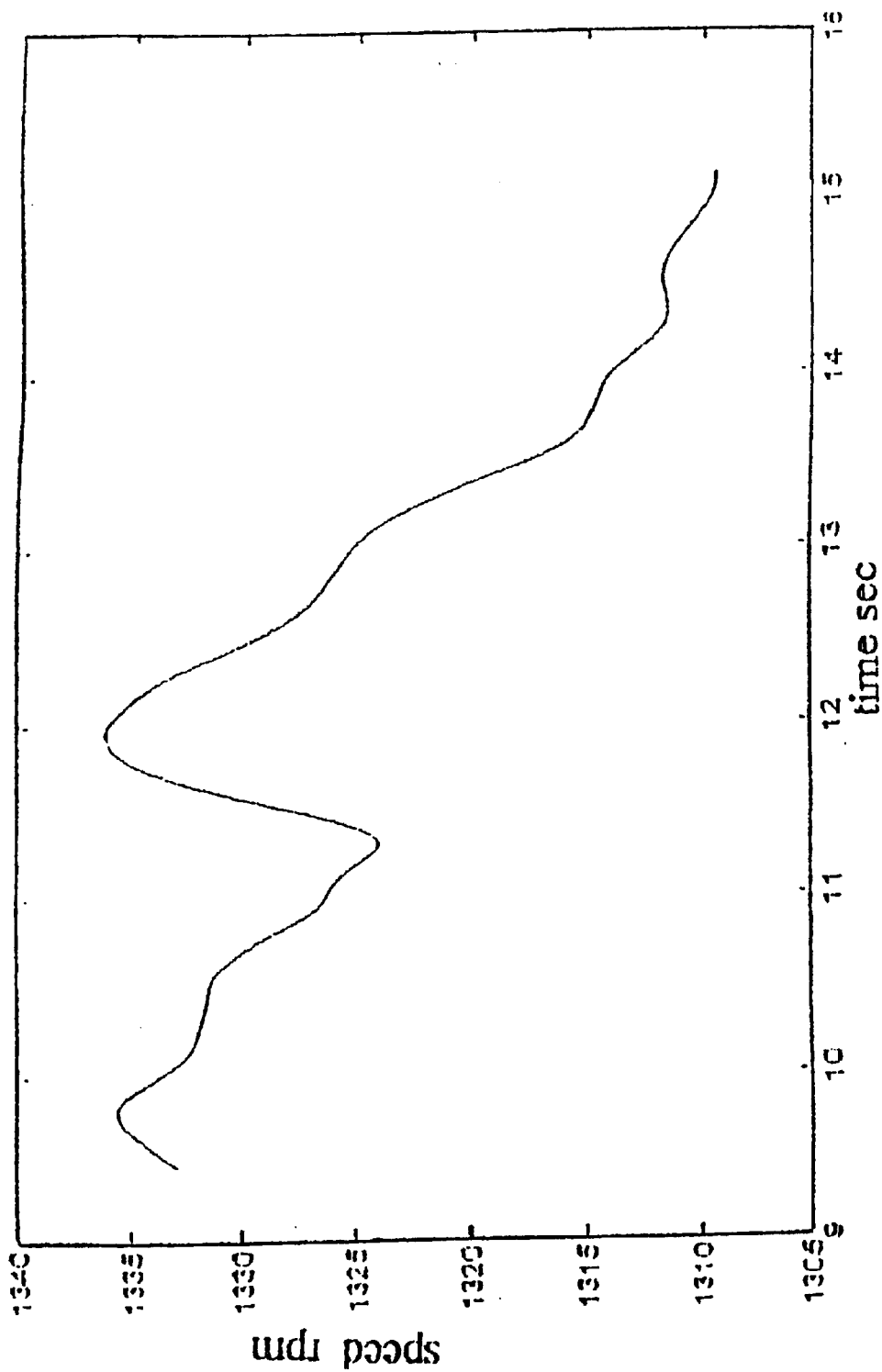

FIG. 23 shows the speed time characteristic for a faulty air conditioner produced by repeatedly adjusting the shutter and deriving and displaying the speed-time characteristic of the fan for different shutter positions. In this case, sharp fluctuations in the speed of the fan are shown, indicative of low quality performance of the air conditioner.

Figure 24:
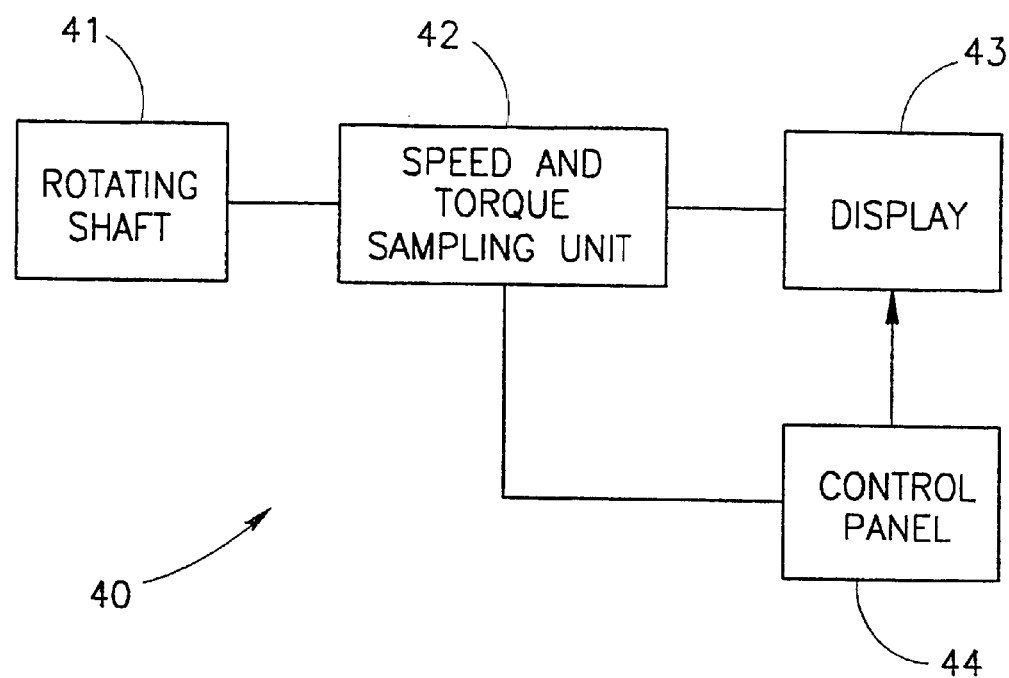
FIG. 24 is a block diagram showing functionally a dynamic torque and speed analyzer for displaying speed or torque characteristics of a rotating shaft derived according to the invention.

FIG. 24 is a block diagram showing functionally a dynamic torque and speed analyzer 40 for displaying speed or torque characteristics of a rotating shaft as derived according to the invention. The dynamic torque and speed analyzer 40 comprises a sampling unit 41 for sampling measured speed or torque over a time interval and from an initial sampling time both selected by the user. A display 42 is coupled to the sampling unit 41 for displaying sampled speed and/or torque characteristics. A control panel 43 allows control of a first x-axis scale in respect of time or frequency, and of a second orthogonal y-axis scale in respect of torque or speed Typically, the x-axis is horizontal and the y-axis is vertical, although this is a matter of convention and, if desired, the axis may be reversed. The control panel 43 allows the sampling time interval of the sampling unit 41 to be adjusted by the user, thus providing greater flexibility, since the longer the sampling time interval, the more samples are obtained.

It will be apparent that modifications may be made to the prefer embodiments without departing from the scope of the invention as defined in the claims. Thus, whilst the preferred embodiment have been described with particular regard to an a.c. PSC induction motor, the invention is equally well suited for use with other types of a.c. and d.c. motor. Obviously, the actual speed-time and speed-torque characteristics of different types of machine will be different, although the characteristics of a given types of machine afford a good indicator of unacceptable departure from the manufacturer's design specification.

Likewise, in the preferred embodiments the time periods of successive pulses generated by the rotary shaft encoder are measured. However, seeing that the invention typically offers a thousand-fold improvement in resolution of tie dynamic effects of the speed and torque characteristics over conventional methods, it is clear that significant improvement is still achieved, even if the periods of only every second or third pulse are measured, for example.

Finally, whilst the invention has been described with particular example to the performance testing of rotating machines, it is to be understood that the invention affords better resolution of the measurement of angular rotation regardless of any specific application to which this is directed.

In the method claims that follow, alphabetic characters used to designate claim steps are provided for convenience only and do not imply any particular order of performing the steps.

What is claimed is:

1. A method for measuring an angular rotation of a rotating shaft, the method characterized by the steps of:
   (a) attaching to the shaft a digital rotary encoder which successively generates opposing binary logic states such that any pair of sequential logic states corresponds to a known angular rotation of the shaft,
   (b) rotating the shaft,
   (c) separately measuring a respective time period associated with each successive logic state generated by the digital rotary encoder, and
   (d) summing said respective time periods associated with each successive logic state so as to derive an accumulated elapsed time interval of successive pairs of logic states generated by the digital rotary encoder thereby allowing derivation of the angular rotation or a function thereof of the shaft.

2. A method for testing an electric motor or of a component thereof, the method characterized by the steps of:
   (a) attaching an unloaded shaft of the electric motor to a digital rotary encoder which generates opposing binary logic states such that any pair of sequential logic states corresponds to a known angular rotation of the rotating electric motor,
   (b) measuring an accumulated elapsed time period of successive pairs of logic states generated by the digital rotary encoder during rotation of the electric motor so as to allow derivation of a dynamic speed-time characteristic of the rotating electric motor or a function thereof, and
   (c) using the dynamic speed-time characteristic of the unloaded rotating electric motor to derive static torque speed or dynamic torque speed or oscillating torque during steady state or speed and torque spectrum during steady state of the unloaded rotating electric motor.

3. A method for testing an electric machine comprising an electric motor and attached load, the method characterized by the steps of:
   (a) attaching a shaft of the electric motor plus load to a digital rotary encoder which generates opposing binary logic states such that any pair of sequential logic states corresponds to a known angular rotation of the rotating electric motor plus load,
   (b) measuring an accumulated elapsed time interval of successive pairs of logic states generated by the digital rotary encoder during rotation of the electric motor plus load so as to allow derivation of a speed-time characteristic of the rotating electric motor plus load or a function thereof, and
   (c) using the speed-time characteristic of the rotating electric motor plus load to derive a combined static torque-speed or a steady state combined oscillating torque-speed or steady state speed spectrum or steady state combined torque spectrum of the rotating electric motor plus load, where the combined torque of the electric motor plus load is equal to the torque of the electric motor minus the torque of the load.

4. The method according to claim 2, wherein step (c) includes:
   (i) computing the time derivative of the dynamic speed-time characteristic, and
   (ii) multiplying the time derivative obtained in (i) by a moment of inertia of the unloaded electric motor so as to derive a dynamic speed-torque characteristic of the unloaded electric motor.

5. The method according to claim 2 for determining oscillating torque during steady state of the electric motor after it has reached steady state speed, wherein step (c) includes:
   (i) computing the time derivative of the dynamic speed-time characteristic during steady state of the electric motor, and
   (ii) multiplying the time derivative obtained in (i) by a moment of inertia of the unloaded electric motor so as to derive a dynamic speed-torque characteristic of the unloaded electric motor in steady state.

6. The method according to claim 2, wherein step (c) includes:
   (i) removing fluctuations on a transient part of the dynamic speed-time characteristic during acceleration of the electric motor until it reaches steady state speed so as to obtain a static speed-time characteristic,
   (ii) computing the time derivative of the static speed-time characteristic, and
   (iii) multiplying the time derivative obtained in (ii) by a moment of inertia of the unloaded electric motor so as to derive a static speed-torque characteristic of the unloaded electric motor.

7. The method according to claim 3, wherein step (c) includes:
   (i) removing fluctuations on a transient part of the dynamic speed-time characteristic during acceleration of the electric motor plus load until it reaches steady state speed so as to obtain a static speed-time characteristic of the electric motor plus load,
   (ii) computing the time derivative of the static speed-time characteristic of the electric motor plus load, and
   (iii) multiplying the time derivative obtained in (ii) by a moment of inertia of the combined electric motor plus load so as to derive a combined static speed-torque characteristic of the electric motor plus load.

8. The method according to claim 6, wherein step (i) of removing fluctuations on the transient effects during acceleration of the electric motor until it reaches steady state speed, includes:
   (1) locking the shaft of the electric motor,
   (2) monitoring the stator current of the electric motor, and
   (3) releasing the shaft of the electric motor when the stator current achieves a steady state value.

9. The method according to claim 6 for use with a PSC type a.c. induction motor having a stator comprising a main coil and an auxiliary coil which may be switched in parallel with the main coil, wherein step (i) of removing fluctuations on the transient effects during acceleration of the electric motor until it reaches steady state speed, includes:
   (1) feeding current initially to the main coil only at a known angle in the a.c. supply voltage cycle,
   (2) monitoring the stator current in the main coil, and
   (3) switching the auxiliary coil in circuit when the stator current in the main coil achieves a steady state value at the same known angle in the a.c. supply voltage cycle.

10. The method according to claim 6, wherein step (i) of removing fluctuations on the transient effects during acceleration of the electric motor until it reaches steady state speed, includes:
    (1) rotating the shaft in an opposite direction to a normal rotation direction, and
    (2) during the time that the rotating electric motor changes direction, commencing sampling of the speed-time characteristics.

11. The method according to claim 6, wherein step (i) of removing fluctuations on the transient effects during acceleration of the electric motor until it reaches steady state speed, includes:
    (1) Fourier transforming the speed-time of the rotating electric motor during acceleration
    (2) filtering the frequency spectrum so as to remove higher frequency components, and
    (3) transforming the resulting spectrum back to the time domain.

12. The method according to claim 7, further including:
    (iv) subtracting the combined static speed-torque characteristic of the rotating electric motor plus load from the speed-torque characteristic of the electric motor derived in claim 2 so as to derive the torque-speed characteristic of the load.

13. The method according to claim 7, further including:
    (v) performing a GO-NOGO of the electric motor plus load as a function of the combined static speed-torque characteristic thereof.

14. The method according to claim 2, for testing relative performance characteristics of stators for use in the electric motor, said method further comprising:
    (d) providing a pre-calibrated rotor for said electric motor,
    (e) providing successive stators and repeating steps (a) to (c) in respect of said stators so as to obtain respective stator-dependent characteristics of the motor.

15. The method according to claim 2, for testing relative performance characteristics of rotors for use in the electric motor, said method further comprising:
    (d) providing a pre-calibrated stator for said electric motor,
    (e) providing successive rotors and repeating steps (a) to (c) in respect of said stators so as to obtain respective rotor-dependent characteristics of the motor.

16. The method according to claim 2, further including:
    (d) deriving a static torque-speed characteristic of the rotating electric motor with an inertial load having a known moment of inertia coupled to the motor shaft, and
    (e) processing the respective torque-speed characteristics of the unloaded electric motor and of the electric motor plus inertial load so as to determine the moment of inertia of a rotor of the electric motor.

17. The method according to claim 4, wherein variations in speed or torque are used as a measure of electric motor noise.

18. The method according to claim 4, wherein variations in speed or torque are used as a measure of electric motor imbalance and vibration.

19. The method according to claim 2, further including:
    (f) Fourier transforming the speed-time characteristic of the rotating electric motor or electric machine so as to derive a speed frequency spectrum, and
    (g) analyzing the speed frequency spectrum of the electric motor or electric motor plus load for determining vibration, unbalance, air-noise, and oscillating torque of the electric motor or the electric motor plus load.

20. The method according to claim 2, further including:
(h) Fourier transforming the torque-time characteristic of the rotating electric motor or electric machine so as to derive a torque frequency spectrum, and
(i) analyzing the torque frequency spectrum of the electric motor or electric motor plus load for determining vibration, unbalance, air-noise, and oscillating torque of the electric motor or the electric motor plus load.

21. The method according to claim 3 for determining oscillating torque during steady state of the electric motor plus load after it has reached steady state speed, wherein step (c) includes:
(i) computing the time derivative of the dynamic speed-time characteristic during steady state of the electric motor plus load, and
(ii) multiplying the time derivative obtained in (i) by a moment of inertia of the electric motor plus load so as to derive a dynamic speed-torque characteristic of the electric motor plus load in steady state.

22. The method according to claim 2, including deriving an oscillating speed characteristic during a build-up to steady state speed of the rotating electric motor, comprising the steps of:
(d) coupling a high inertia flywheel to the rotating shaft so as deliberately to slow down the time to reach steady-state,
(e) deriving a steady-state speed-time characteristic of the rotating electric motor varying speed thereof subsequent to attainment of steady state performance, and
(f) zooming in on a desired range of speeds of the rotating electric motor so as to derive for a limited time frame the speed-time characteristics having superimposed thereon said oscillating speed characteristic.

23. The method according to claim 2 for deriving an oscillating torque characteristic at a steady state speed of the rotating electric motor, further comprising the step of:
(g) differentiating the speed-time curve with respect to time and multiplying by a moment of inertia of the rotating electric motor so as to derive varying torque as a function of time.

24. Use of the method according to claim 3 for testing in real time steady state vibration, unbalance, noise or oscillating torque of a rotating electric motor plus load, including:
(i) maintaining said shaft coupled to the digital rotary encoder for a desired time duration,
(ii) constantly measuring in real time during said desired time duration said respective time periods of pulses generated by the digital rotary encoder during rotation of the electric motor plus load,
(iii) constantly deriving the steady state combined oscillating torque-speed or the steady state speed spectrum or the steady state combined torque spectrum of the rotating electric motor plus load, and
(iv) determining a departure in any of the characteristics derived in (iii) from a nominal rating thereof.

25. The method according to claim 3, for testing an operational performance of an air-conditioner, wherein the electric motor is coupled to a fan of the air-conditioner, and there are included the steps of:
(b) allowing the fan to reach steady-state speed,
(c) deriving the speed-time characteristic of the fan, and
(d) Fourier transforming the speed-time or torque-time characteristic of the rotating electric motor plus fan so as to derive a frequency speed spectrum or frequency torque spectrum for testing vibration, unbalance or air noise oscillating torque;
whereby a frequency harmonic in the speed or torque of the air conditioner having a high amplitude, indicative of low quality thereof, is highlighted.

26. The method according to claim 3, for testing an operational performance of an air-conditioner having an adjustable shutter for adjusting a direction of airflow, wherein the electric motor is coupled to a fan of the air-conditioner, and there are included the steps of:
(e) allowing the fan to reach steady-state speed, and
(f) repeatedly adjusting the shutter and deriving and displaying the speed-time characteristic of the fan for different shutter positions;
whereby sharp fluctuations in the speed of the fan, indicative of low quality performance thereof, are highlighted.

27. A method for displaying speed or torque characteristics of a rotating shaft derived according to claim 2, further including the steps of:
(g) sampling measured speed or torque at regular time intervals from a known initial sampling time,
(h) displaying at said regular time intervals said measured speed or torque samples versus time or frequency in an analogous way to using an oscilloscope or spectrum analyzer for voltage,
(i) controlling a first x-axis scale in respect of time or frequency while sampling the speed or torque in an analogous way to using an oscilloscope or spectrum analyzer for voltage, and
(j) controlling a second orthogonal y-axis scale in respect of torque or speed amplitude in an analogous way to using an oscilloscope or spectrum analyzer for voltage.

28. An apparatus for measuring an angular rotation of a rotating shaft, the apparatus comprising:
a coupling unit for attaching to the shaft a digital rotary encoder which generates opposing binary logic states for a known angular rotation of the shaft, such that any pair of sequential logic states corresponds to a known angular rotation of the shaft,
a pair of timers for measuring respective time periods of successive opposing binary logic states generated by the digital rotary encoder, and
a computer coupled to the timers for summing said respective time periods associated with each successive logic state so as to derive an accumulated elapsed time of successive pairs of logic states generated by the digital rotary encoder thereby allowing derivation of the angular rotation or a function thereof of the shaft.

29. An apparatus for testing a rotating electric motor or a component thereof, the apparatus comprising:
a coupling unit for attaching a shaft of the rotating electric motor to a digital rotary encoder, and
a power supply for supplying power to the rotating electric motor at a specified time;
characterized by:
the digital rotary encoder generating opposing binary logic states for a known angular rotation of the electric motor, such that any pair of sequential logic states corresponds to a known angular rotation of the electric motor,
a pair of timers for measuring a respective elapsed time period of successive pairs of logic states generated by the digital rotary encoder during rotation of the electric motor, and a computer coupled to the timers for successively receiving a respective time period from a first one of the timers, computing an associated time period and initializing a second one of the timers, and accumulating respective time periods of the successive opposing binary logic states generated by the digital rotary encoder so as to allow derivation of a dynamic speed characteristic of the rotating electric motor and for using the dynamic speed-time characteristic of the unloaded rotating electric motor to derive static torque speed or dynamic torque speed or oscillating torque during steady state or speed and torque spectrum during steady state of the unloaded rotating electric motor.

30. An apparatus for testing a rotating electric motor plus load comprising:

a coupling unit for attaching a shaft of the rotating electric motor plus load to a digital rotary encoder, and a power supply for supplying power to the rotating electric motor at a specified time;

characterized by:

the digital rotary encoder generating opposing binary logic states for a known angular rotation of the electric motor, such that any pair of sequential logic states corresponds to a known angular rotation of the electric motor, a pair of timers for measuring a respective elapsed time period of successive pairs of logic states generated by the digital rotary encoder during rotation of the electric motor plus load, and a computer coupled to the timers for successively receiving a respective time period from a first one of the timers, computing an associated time period and initializing a second one of the timers, and accumulating respective time periods of the successive opposing binary logic states generated by the digital rotary encoder so as to allow derivation of a dynamic speed characteristic of the rotating electric motor plus load and for using the dynamic speed-time characteristic of the rotating electric motor plus load to derive combined static torque speed or a steady state combined oscillating torque-speed or steady state speed spectrum or steady state combined torque spectrum of the rotating electric motor plus load, where the combined torque of the electric motor plus load is equal to the torque of the electric motor minus the torque of the load.

31. The apparatus according to claim 29, further including a display device coupled to the computer for displaying graphically the characteristics computed thereby.

32. The apparatus according to claim 29 being adapted to remove transient effects so as to derive static torque-speed characteristics of the electric motor.

33. The apparatus according to claim 30 being adapted to remove transient effects so as to derive combined static torque-speed characteristics of the rotating electric motor plus load.

34. The apparatus according to claim 29 wherein the timers comprise:

an oscillator for producing high frequency clock pulses of known frequency at an output thereof, and first and second counters each having a clock input (CLK) coupled to the output of the oscillator, each having an enable input (ENABLE) coupled to the shaft encoder and responsive to mutually opposing logic states thereof for feeding to a computer coupled thereto respective logic states of the shaft encoder so as to allow the computer to compute an accumulated time period of the opposing logic states, and each having a reset terminal (RST) responsively coupled to the computer so as to enable the first and seconds counters to be reset thereby.

35. The apparatus according to claim 29 for displaying speed or torque characteristics of a rotating shaft, further including:

a sampling unit for sampling measured speed or torque at regular time intervals from a known initial sampling time, a display for displaying at said regular time intervals said measured speed or torque samples versus time or frequency in an analogous way to using an oscilloscope or spectrum analyzer for voltage, and a control panel for controlling a first x-axis scale in respect of time or frequency and a second orthogonal y-axis scale in respect of torque or speed amplitude while sampling the speed or torque in an analogous way to using an oscilloscope or spectrum analyzer for voltage.

36. The apparatus according to claim 35, wherein the control panel includes a control for adjusting said time intervals.

37. The apparatus according to claim 35, wherein the control panel includes a control for adjusting the initial sampling time.

38. A method for testing an electric motor or of a component thereof, the method characterized by the steps of:

(a) measuring a dynamic speed-time characteristic of the unloaded rotating electric motor, and (b) using the dynamic speed-time characteristic of the unloaded rotating electric motor to derive static torque speed or dynamic torque speed or oscillating torque during steady state or speed and torque spectrum during steady state of the unloaded rotating electric motor.

39. A method for testing an electric machine comprising an electric motor and attached load, the method characterized by the steps of:

(a) measuring a speed-time characteristic of the rotating electric motor plus load, and (b) using the speed-time characteristic of the rotating electric motor plus load to derive a combined static torque-speed or a steady state combined oscillating torque-speed or steady state speed spectrum or steady state combined torque spectrum of the rotating electric motor plus load, where the combined torque of the electric motor plus load is equal to the torque of the electric motor minus the torque of the load.

40. The method according to claim 38, wherein step (b) includes:

(i) computing the time derivative of the dynamic speed-time characteristic, and (ii) multiplying the time derivative obtained in (i) by a moment of inertia of the unloaded electric motor so as to derive a dynamic speed-torque characteristic of the unloaded electric motor.

41. The method according to claim 38 for determining oscillating torque during steady state of the electric motor after it has reached steady state speed, wherein step (b) includes:

(i) computing the time derivative of the dynamic speed-time characteristic during steady state of the electric motor, and (ii) multiplying the time derivative obtained in (i) by a moment of inertia of the unloaded electric motor so as to derive a dynamic speed-torque characteristic of the unloaded electric motor in steady state.

42. The method according to claim 38, wherein step (b) includes:
   (i) removing fluctuations on a transient part of the dynamic speed-time characteristic during acceleration of the electric motor until it reaches steady state speed so as to obtain a static speed-time characteristic,
   (ii) computing the time derivative of the static speed-time characteristic, and
   (iii) multiplying the time derivative obtained in (ii) by a moment of inertia of the unloaded electric motor so as to derive a static speed-torque characteristic of the unloaded electric motor.

43. The method according to claim 39, wherein step (b) includes:
   (i) removing fluctuations on a transient part of the dynamic speed-time characteristic during acceleration of the electric motor plus load until it reaches steady state speed so as to obtain a static speed-time characteristic of the electric motor plus load,
   (ii) computing the time derivative of the static speed-time characteristic of the electric motor plus load, and
   (iii) multiplying the time derivative obtained in (ii) by a moment of inertia of the combined electric motor plus load so as to derive a combined static speed-torque characteristic of the electric motor plus load.

44. The method according to claim 42, wherein step (i) of removing fluctuations on the transient effects during acceleration of the electric motor until it reaches steady state speed, includes:
   (1) locking the shaft of the electric motor,
   (2) monitoring the stator current of the electric motor, and
   (3) releasing the shaft of the electric motor when the stator current achieves a steady state value.

45. The method according to claim 42 for use with a PSC type a.c. induction motor having a stator comprising a main coil and an auxiliary coil which may be switched in parallel with the main coil, wherein step (i) of removing fluctuations on the transient effects during acceleration of the electric motor until it reaches steady state speed, includes:
   (1) feeding current initially to the main coil only at a known angle in the a.c. supply voltage cycle,
   (2) monitoring the stator current in the main coil, and
   (3) switching the auxiliary coil in circuit when the stator current in the main coil achieves a steady state value at the same known angle in the a.c. supply voltage cycle.

46. The method according to claim 42, wherein step (i) of removing fluctuations on the transient effects during acceleration of the electric motor until it reaches steady state speed, includes:
   (1) rotating the shaft in an opposite direction to a normal rotation direction, and
   (2) during the time that the rotating electric motor changes direction, commencing sampling of the speed-time characteristics.

47. The method according to claim 42, wherein step (i) of removing fluctuations on the transient effects during acceleration of the electric motor until it reaches steady state speed, includes:
   (1) Fourier transforming the speed-time of the rotating electric motor during acceleration
   (2) filtering the frequency spectrum so as to remove higher frequency components, and
   (3) transforming the resulting spectrum back to the time domain.

48. The method according to claim 43, further including:
   (vi) subtracting the combined static speed-torque characteristic of the rotating electric motor plus load from the speed-torque characteristic of the electric motor derived in claim 43 so as to derive the torque-speed characteristic of the load.

49. The method according to claim 43, further including:
   (vii) performing a GO-NOGO of the electric motor plus load as a function of the combined static speed-torque characteristic thereof.

50. The method according to claim 38, for testing relative performance characteristics of stators for use in the electric motor, said method further comprising:
   (f) providing a pre-calibrated rotor for said electric motor,
   (g) providing successive stators and repeating steps (a) to (c) in respect of said stators so as to obtain respective stator-dependent characteristics of the motor.

51. The method according to claim 38, for testing relative performance characteristics of rotors for use in the electric motor, said method further comprising:
   (f) providing a pre-calibrated stator for said electric motor,
   (g) providing successive rotors and repeating steps (a) to (c) in respect of said stators so as to obtain respective rotor-dependent characteristics of the motor.

52. The method according to claim 38, further including:
   (j) deriving a static torque-speed characteristic of the rotating electric motor with an inertial load having a known moment of inertia coupled to the motor shaft, and
   (k) processing the respective torque-speed characteristics of the unloaded electric motor and of the electric motor plus inertial load so as to determine the moment of inertia of a rotor of the electric motor.

53. The method according to claim 40, wherein variations in speed or torque are used as a measure of electric motor noise.

54. The method according to claim 40, wherein variations in speed or torque are used as a measure of electric motor imbalance and vibration.

55. The method according to claim 38, further including:
   (l) Fourier transforming the speed-time characteristic of the rotating electric motor or electric motor plus load so as to derive a speed frequency spectrum, and
   (m) analyzing the speed frequency spectrum of the electric motor or electric motor plus load for determining vibration, unbalance, air-noise, and oscillating torque of the electric motor or the electric motor plus load.

56. The method according to claim 38, further including:
   (n) Fourier transforming the torque-time characteristic of the rotating electric motor or electric motor plus load so as to derive a torque frequency spectrum, and
   (o) analyzing the torque frequency spectrum of the electric motor or electric motor plus load for determining vibration, unbalance, air-noise, and oscillating torque of the electric motor or the electric motor plus load.

57. The method according to claim 39 for determining oscillating torque during steady state of the electric motor plus load after it has reached steady state speed, wherein step (b) includes:
   (i) computing the time derivative of the dynamic speed-time characteristic during steady state of the electric motor plus load, and (ii) multiplying the time derivative obtained in (i) by a moment of inertia of the electric motor plus load so as to derive a dynamic speed-torque characteristic of the electric motor plus load in steady state.

58. The method according to claim 38, including deriving an oscillating speed characteristic during a build-up to steady state speed of the rotating electric motor, comprising the steps of:
- (g) coupling a high inertia flywheel to the rotating shaft so as deliberately to slow down the time to reach steady-state,
- (h) deriving a steady-state speed-time characteristic of the rotating electric motor varying speed thereof subsequent to attainment of steady state performance, and
- (i) zooming in on a desired range of speeds of the rotating electric motor so as to derive for a limited time frame the speed-time characteristics having superimposed thereon said oscillating speed characteristic.

59. The method according to claim 38 for deriving an oscillating torque characteristic at a steady state speed of the rotating electric motor, further comprising the step of:
- (h) differentiating the speed-time curve with respect to time and multiplying by a moment of inertia of the rotating electric motor so as to derive varying torque as a function of time.

60. Use of the method according to claim 39 for testing in real time steady state vibration, unbalance, noise or oscillating torque of a rotating electric motor plus load, including:
- (i) maintaining said shaft coupled to the digital rotary encoder for a desired time duration,
- (ii) constantly measuring in real time during said desired time duration said respective time periods of pulses generated by the digital rotary encoder during rotation of the electric motor plus load,
- (iii) constantly deriving the steady state combined oscillating torque-speed or the steady state speed spectrum or the steady state combined torque spectrum of the rotating electric motor plus load, and
- (iv) determining a departure in any of the characteristics derived in (iii) from a nominal rating thereof.

61. The method according to claim 39, for testing an operational performance of an air-conditioner, wherein the electric motor is coupled to a fan of the air-conditioner, and there are included the steps of:
- (k) allowing the fan to reach steady-state speed,
- (l) deriving the speed-time characteristic of the fan, and
- (m) Fourier transforming the speed-time or torque-time characteristic of the rotating electric motor plus fan so as to derive a frequency speed spectrum or frequency torque spectrum for testing vibration, unbalance or air noise oscillating torque;

whereby a frequency harmonic in the speed or torque of the air conditioner having a high amplitude, indicative of low quality thereof, is highlighted.

62. The method according to claim 39, for testing an operational performance of an air-conditioner having an adjustable shutter for adjusting a direction of airflow, wherein the electric motor is coupled to a fan of the air-conditioner, and there are included the steps of:
- (n) allowing the fan to reach steady-state speed, and
- (o) repeatedly adjusting the shutter and deriving and displaying the speed-time characteristic of the fan for different shutter positions;

whereby sharp fluctuations in the speed of the fan, indicative of low quality performance thereof, are highlighted.

63. A method for displaying speed or torque characteristics of a rotating shaft derived according to claim 38, further including the steps of:
- (p) sampling measured speed or torque at regular time intervals from a known initial sampling time,
- (q) displaying at said regular time intervals said measured speed or torque samples versus time or frequency in an analogous way to using an oscilloscope or spectrum analyzer for voltage,
- (r) controlling a first x-axis scale in respect of time or frequency while sampling the speed or torque in an analogous way to using an oscilloscope or spectrum analyzer for voltage, and
- (s) controlling a second orthogonal y-axis scale in respect of torque or speed amplitude in an analogous way to using an oscilloscope or spectrum analyzer for voltage.

64. An apparatus for measuring an angular rotation of a rotating electric motor or component thereof, the apparatus comprising:
- a coupling unit for attaching a shaft of the electric motor to a digital rotary encoder for accurately measuring an angular rotation of the shaft,
- a power supply for supplying power to the rotating electric motor at a specified time, and
- a computer coupled to the digital rotary encoder for deriving a speed characteristic of the rotating electric motor;

characterized in that:
- the computer measures a dynamic speed-time characteristic of the unloaded rotating electric motor, and uses the dynamic speed-time characteristic of the unloaded rotating electric motor to derive static torque speed or dynamic torque speed or oscillating torque during steady state or speed and torque spectrum during steady state of the unloaded rotating electric motor.

65. An apparatus for testing a rotating electric motor plus load comprising:
- a coupling unit for attaching a shaft of the rotating electric motor plus load to a digital rotary encoder,
- a power supply for supplying power to the rotating electric motor at a specified time, and
- a computer coupled to the digital rotary encoder for deriving a speed characteristic of the rotating electric motor;

characterized in that:
- the computer measures a dynamic speed characteristic of the rotating electric motor plus load and uses the dynamic speed-time characteristic of the rotating electric motor plus load to derive combined static torque speed or a steady state combined oscillating torque-speed or steady state speed spectrum or steady state combined torque spectrum of the rotating electric motor plus load, where the combined torque of the electric motor plus load is equal to the torque of the electric motor minus the torque of the load.

66. The apparatus according to claim 64, further including a display device coupled to the computer for displaying graphically the characteristics computed thereby.

67. The apparatus according to claim 64 being adapted to remove transient effects so as to derive static torque-speed characteristics of the electric motor.

68. The apparatus according to claim 65 being adapted to remove transient effects so as to derive combined static torque-speed characteristics of the rotating electric motor plus load.

69. The apparatus according to claim 64 for displaying speed or torque characteristics of a rotating shaft, further including:
- a sampling unit for sampling measured speed or torque at regular time intervals from a known initial sampling time,
- a display for displaying at said regular time intervals said measured speed or torque samples versus time or frequency in an analogous way to using an oscilloscope or spectrum analyzer for voltage, and
- a control panel for controlling a first x-axis scale in respect of time or frequency and a second orthogonal y-axis scale in respect of torque or speed amplitude while sampling the speed or torque in an analogous way to using an oscilloscope or spectrum analyzer for voltage.

70. The apparatus according to claim 69, wherein the control panel includes a control for adjusting said time intervals.

71. The apparatus according to claim 69, wherein the control panel includes a control for adjusting the initial sampling time.

* * * * *